(12) United States Patent
Karczewicz

(10) Patent No.: US 6,696,993 B2
(45) Date of Patent: Feb. 24, 2004

(54) VARIABLE LENGTH CODING

(75) Inventor: Marta Karczewicz, Irving, TX (US)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 10/103,976

(22) Filed: Mar. 22, 2002

(65) Prior Publication Data

US 2003/0048208 A1 Mar. 13, 2003

Related U.S. Application Data

(60) Provisional application No. 60/278,383, filed on Mar. 23, 2001.

(51) Int. Cl.$^7$ .............................. H03M 7/40; G06K 9/36; G06K 9/46
(52) U.S. Cl. .................... 341/67; 375/240.23; 382/246
(58) Field of Search ....................... 341/67; 375/240.16, 375/240.04, 240.03, 240.14, 240.23; 382/232, 248, 244, 246; 708/402; 712/1, 200, 208, 209, 300

(56) References Cited

U.S. PATENT DOCUMENTS

| | | | | |
|---|---|---|---|---|
| 5,225,832 A | * | 7/1993 | Wang et al. .................... | 341/67 |
| 5,295,203 A | * | 3/1994 | Krause et al. ............... | 382/248 |
| 5,638,069 A | * | 6/1997 | Rensink et al. ................ | 341/67 |
| 5,654,706 A | | 8/1997 | Jeong | |
| 6,058,142 A | * | 5/2000 | Ishikawa et al. ........ | 375/240.16 |
| 6,198,848 B1 | | 3/2001 | Honma et al. | |

FOREIGN PATENT DOCUMENTS

EP 0719052 A2 6/1996

OTHER PUBLICATIONS

ITU, Q.6/SG16 (VCEG), Doc. VCEG–M51, "Improved Intra Coding", 2001.
ITU, Q.15/SG16, Doc. Q15–K–59, "H.26L Test Model Long Term No. 5 (TML–5) draft0", 2000.
ITU, Q.15/SG 16, Doc. Q15–K–30, "Use Of Adaptive Switching Between Two VLCs For Intra Luma Coefficients", 2000.
ITU, Q.6/SG16 (VCEG), Doc. VCEG–L28, "VLC Concatenation For Intra Coding", 2001, (Excell worksheet is attached).
"Image And Video Compression Standards", 2$^{nd}$ Edition, Bhaskaran et al., Kluwer Academic Publishers, 1999.
"Digital Compression And Coding Of Continuous–Tone Still Images", ITU–T recommendation T.81, 1992.

* cited by examiner

*Primary Examiner*—Patrick Wamsley
(74) *Attorney, Agent, or Firm*—Perman & Green LLP

(57) ABSTRACT

The invention relates to a method of variable length coding in which data symbols are arranged into a number of sets, each of which comprises at least a first data symbol. At least two sets of variable length codewords are provided for variable length coding the data symbols and the sets of data symbols are variable length coded in a coding sequence, starting from a first set and progressing to a last set of data symbols. For a given set of data symbols, other than the first set of data symbols in the coding sequence, a set of cumulative information measures is determined, each of which is representative of a total amount of information required to variable length code the first data symbols of all the sets of data symbols preceding the given set of data symbols in the coding sequence using a predetermined one of the at least two sets of variable length codewords. The set of cumulative information measures is examined to determine which of the at least two sets of variable length codewords provides the smallest cumulative information measure and a codeword is selected to variable length code the first data symbol of the given set of data symbols from the set of variable length codewords which provides the smallest cumulative information measure. A corresponding encoder, decoding method and decoder are also described.

73 Claims, 8 Drawing Sheets

VARIABLE LENGTH CODING

CROSS-REFERENCE TO RELATED APPLICATION

This application claims the benefit of U.S. provisional application No. 60/278,383 filed Mar. 23, 2001, which is incorporated by reference herein in its entirety.

FIELD OF THE INVENTION

The invention concerns the variable length coding of data symbols. More specifically, the invention relates to a method of variable length coding suitable for application in the coding of digital video.

BACKGROUND OF THE INVENTION

Digital video sequences, like ordinary motion pictures recorded on film, comprise a sequence of still images, the illusion of motion being created by displaying the images one after the other at a relatively fast rate, typically 15 to 30 frames per second. Because of the relatively fast display rate, images in consecutive frames tend to be quite similar and thus contain a considerable amount of redundant information. For example, a typical scene may comprise some stationary elements, such as background scenery, and some moving areas, which may take many different forms, for example the face of a newsreader, moving traffic and so on. Alternatively, the camera recording the scene may itself be moving, in which case all elements of the image have the same kind of motion. In many cases, this means that the overall change between one video frame and the next is rather small.

Each frame of an uncompressed digital video sequence comprises an array of image pixels. For example, in a commonly used digital video format, known as the Quarter Common Interchange Format (QCIF), a frame comprises an array of 176×144 pixels, in which case each frame has 25,344 pixels. In turn, each pixel is represented by a certain number of bits, which carry information about the luminance and/or colour content of the region of the image corresponding to the pixel. Commonly, a so-called YUV colour model is used to represent the luminance and chrominance content of the image. The luminance, or Y, component represents the intensity (brightness) of the image, while the colour content of the image is represented by two chrominance or colour difference components, labelled U and V.

Colour models based on a luminance/chrominance representation of image content provide certain advantages compared with colour models that are based on a representation involving primary colours (that is Red, Green and Blue, RGB). The human visual system is more sensitive to intensity variations than it is to colour variations and YUV colour models exploit this property by using a lower spatial resolution for the chrominance components (U, V) than for the luminance component (Y). In this way, the amount of information needed to code the colour information in an image can be reduced with an acceptable reduction in image quality.

The lower spatial resolution of the chrominance components is usually attained by sub-sampling. Typically, each frame of a video sequence is divided into so-called 'macroblocks', which comprise luminance (Y) information and associated chrominance (U, V) information that is spatially sub-sampled. FIG. 3 illustrates one way in which macroblocks can be formed. FIG. 3a shows a frame of a video sequence represented using a YUV colour model, each component having the same spatial resolution. Macroblocks are formed by representing a region of 16×16 image pixels in the original image (FIG. 3b) as four blocks of luminance information, each luminance block comprising an 8×8 array of luminance (Y) values and two spatially corresponding chrominance components (U and V) which are sub-sampled by a factor of two in the x and y directions to yield corresponding arrays of 8×8 chrominance (U, V) values (see FIG. 3c). According to certain video coding recommendations, such as International Telecommunications Union (ITU-T) recommendation H.26L, the block size used within the macroblocks can be other than 8×8, for example 4×8 or 4×4. (See ITU-T Q.15/SG16 "H.26L Test Model Long Term Number 5 (TML-5) draft 0", Doc. Q15-K-59, October 2000, Section 2.3).

A QCIF image comprises 11×9 macroblocks. If the luminance blocks and chrominance blocks are represented with 8 bit resolution (that is by numbers in the range 0 to 255), the total number of bits required per macroblock is (16×16×8)+2×(8×8×8)=3072 bits (assuming that the two chrominance components are divided into 8×8 blocks). The number of bits needed to represent a video frame in QCIF format is thus 99×3072=304,128 bits. This means that the amount of data required to transmit/record/display an uncompressed video sequence in QCIF format, represented using a YUV colour model, at a rate of 30 frames per second, is more than 9 Mbps (million bits per second). This is an extremely high data rate and is impractical for use in video recording, transmission and display applications because of the very large storage capacity, transmission channel capacity and hardware performance required.

If video data is to be transmitted over a fixed line network such as an ISDN (Integrated Services Digital Network) or a conventional PSTN (Public Switched Telephone Network), the available data transmission bandwidth is typically of the order of 64 kbits/s. In mobile video telephony, where transmission takes place at least in part over a radio communications link, the available bandwidth can be as low as 20 kbits/s. This means that a significant reduction in the amount of information used to represent video data must be achieved in order to enable transmission of digital video sequences over low bandwidth communication networks. For this reason, video compression techniques have been developed which reduce the amount of information transmitted, while retaining an acceptable image quality.

Video compression methods are based on reducing the redundant information in video sequences. The redundancy in video sequences can be categorised into spatial, temporal and spectral redundancy. 'Spatial redundancy' is the term used to describe the correlation (similarity) between neighbouring pixels within a frame. The term 'temporal redundancy' expresses the fact that objects appearing in one frame of a sequence are likely to appear in subsequent frames, while 'spectral redundancy' refers to the correlation between different colour components of the same image.

Sufficiently efficient compression cannot usually be achieved by simply reducing the various forms of redundancy in a given sequence of images. Thus, most current video encoders also reduce the quality of those parts of the video sequence that are subjectively the least important. In addition, the redundancy of the compressed video bit-stream itself is reduced by means of efficient loss-less encoding. Generally, this is achieved using a technique known as entropy coding, which will be described in greater detail later in the text.

There is often a significant amount of spatial redundancy between the pixels that make up each frame of a digital video sequence. In other words, the value of any pixel within a frame of the sequence is substantially the same as the value of other pixels in its immediate vicinity. Typically, video coding systems reduce spatial redundancy using a technique known as 'block-based transform coding', in which a mathematical transformation is applied to the pixels of an image, on a macroblock-by-macroblock basis. Transform coding translates the image data from a representation comprising pixel values to a form comprising a set of coefficient values, each of which is a weighting factor (multiplier) for a basis function of the transform in question. By using certain mathematical transformations, such as the two-dimensional Discrete Cosine Transform (DCT), which transforms the image data from the pixel value domain to a spatial frequency representation, the spatial redundancy within a frame of a digital video sequence can be significantly reduced, thereby producing a more compact representation of the image data.

Frames of a video sequence which are compressed using block-based transform coding, without reference to any other frame within the sequence, are referred to as INTRA-coded or I-frames. Additionally, and where possible, blocks of INTRA-coded frames are predicted from previously coded blocks within the same frame. This technique, known as INTRA-prediction, has the effect of further reducing the amount of data required to represent an INTRA-coded frame.

Generally, video coding systems not only reduce the spatial redundancy within individual frames of a video sequence, but also make use of a technique known as 'motion-compensated prediction', to reduce the temporal redundancy in the sequence. Using motion-compensated prediction, the image content of some (often many) frames in a digital video sequence is 'predicted' from one or more other frames in the sequence, known as 'reference' or 'anchor' frames. Prediction of image content is achieved by tracking the motion of objects or regions of an image between a frame to be coded (compressed) and the reference frame(s) using 'motion vectors'. In general, the reference frame(s) may precede the frame to be coded or may follow it in the video sequence. As in the case of INTRA-coding, motion compensated prediction of a video frame is typically performed macroblock-by-macroblock.

Frames of a video sequence which are compressed using motion-compensated prediction are generally referred to as INTER-coded or P-frames. Motion-compensated prediction alone rarely provides a sufficiently precise representation of the image content of a video frame and therefore it is typically necessary to provide a so-called 'prediction error' (PE) frame with each INTER-coded frame. The prediction error frame represents the difference between the motion compensated prediction of the INTER-coded frame and the image content of the frame to be coded. More specifically, the prediction error frame comprises values that represent the difference between pixel values in the frame to be coded and corresponding pixel values formed on the basis of a predicted version of the frame in question. Consequently, the prediction error frame has characteristics similar to a still image and block-based transform coding can be applied in order to reduce its spatial redundancy and hence the amount of data (number of bits) required to represent it. In general INTER-coded frames may also include some INTRA-coded macroblocks.

In order to illustrate the operation of a video coding system in greater detail, reference will now be made to FIGS. 1 and 2. FIG. 1 is a schematic diagram of a generic video encoder that employs a combination of INTRA- and INTER-coding to produce a compressed (encoded) video bit-stream. A corresponding decoder is illustrated in FIG. 2 and will be described later in the text.

The video encoder 100 comprises an input 101 for receiving a digital video signal from a camera or other video source (not shown). It also comprises a transformation unit 104 which is arranged to perform a block-based discrete cosine transform (DCT), a quantiser 106, an inverse quantiser 108, an inverse transformation unit 110, arranged to perform an inverse block-based discrete cosine transform (IDCT), combiners 112 and 116, and a frame store 120. The encoder further comprises a motion estimator 130, a motion field coder 140 and a motion compensated predictor 150. Switches 102 and 114 are operated co-operatively by control manager 160 to switch the encoder between an INTRA-mode of video encoding and an INTER-mode of video encoding. The encoder 100 also comprises a video multiplex coder 170 which forms a single bit-stream from the various types of information produced by the encoder 100 for further transmission to a remote receiving terminal or, for example, for storage on a mass storage medium, such as a computer hard drive (not shown).

Encoder 100 operates as follows. Each frame of uncompressed video data provided from the video source to input 101 is received and processed macroblock by macroblock, preferably in raster-scan order. When the encoding of a new video sequence starts, the first frame to be encoded is encoded as an INTRA-coded frame. Subsequently, the encoder is programmed to code each frame in INTER-coded format, unless one of the following conditions is met: 1) it is judged that the current macroblock of the frame being coded is so dissimilar from the pixel values in the reference frame used in its prediction that excessive prediction error information would be produced, in which case the current macroblock is coded in INTRA-coded format; 2) a predefined INTRA frame repetition interval has expired; or 3) feedback is received from a receiving terminal indicating a request for a frame to be provided in INTRA-coded format.

The occurrence of condition 1) is detected by monitoring the output of the combiner 116. The combiner 116 forms a difference between the current macroblock of the frame being coded and its prediction, produced in the motion compensated prediction block 150. If a measure of this difference (for example a sum of absolute differences of pixel values, SAD) exceeds a predetermined threshold, the combiner 116 informs the control manager 160 via a control line 119 and the control manager 160 operates the switches 102 and 114 via control line 113 so as to switch the encoder 100 into INTRA-coding mode. In this way, a frame which is otherwise encoded in INTER-coded format may comprise INTRA-coded macroblocks. Occurrence of condition 2) is monitored by means of a timer or frame counter implemented in the control manager 160, in such a way that if the timer expires, or the frame counter reaches a predetermined number of frames, the control manager 160 operates the switches 102 and 114 via control line 113 to switch the encoder into INTRA-coding mode. Condition 3) is triggered if the control manager 160 receives a feedback signal from, for example, a receiving terminal, via control line 121 indicating that an INTRA frame refresh is required by the receiving terminal. Such a condition may arise, for example, if a previously transmitted frame is badly corrupted by interference during its transmission, rendering it impossible to decode at the receiver. In this situation, the receiving decoder issues a request for the next frame to be encoded in INTRA-coded format, thus re-initialising the coding sequence.

Operation of the encoder 100 in INTRA-coding mode will now be described. In INTRA-coding mode, the control manager 160 operates the switch 102 to accept video input from input line 118. The video signal input is received macroblock by macroblock from input 101 via the input line 118. As they are received, the blocks of luminance and chrominance values which make up a macroblock are passed to the DCT transformation block 104, which performs a 2-dimensional discrete cosine transform on each block of values, producing a 2-dimensional array of DCT coefficients for each block. The number of coefficient values depends on the dimensions of the blocks comprised by the macroblock. For example, if the block size used in the macroblock is 4×4, DCT transformation block 104 produces a 4×4 array of DCT coefficients for each block. If the block size is 8×8, an 8×8 array of DCT coefficients is produced.

The DCT coefficients for each block are passed to quantiser 106 where they are quantised using a quantisation parameter QP. Selection of the quantisation parameter QP is controlled by the control manager 160 via control line 115. Quantisation introduces a loss of information, as the quantised coefficients have a lower numerical precision than the coefficients originally generated by the DCT transformation block 104. This provides a further mechanism by which the amount of data required to represent each image of the video sequence can be reduced. However, unlike the DCT transformation, which is essentially loss-less, the loss of information introduced by quantisation causes an irreversible degradation in image quality. The greater the degree of quantisation applied to the DCT coefficients, the greater the loss of image quality.

The quantised DCT coefficients for each block are passed from the quantiser 106 to the video multiplex coder 170, as indicated by line 125 in FIG. 1. The video multiplex coder 170 orders the quantised transform coefficients for each block using a zigzag scanning procedure. This operation converts the two-dimensional array of quantised transform coefficients into a one-dimensional array. Typical zigzag scanning orders, such as that for a 4×4 array shown in FIG. 4, order the coefficients approximately in ascending order of spatial frequency. This also tends to order the coefficients according to their values, such that coefficients positioned earlier in the one-dimensional array are more likely to have larger absolute values than coefficients positioned later in the array. This is because lower spatial frequencies tend to have higher amplitudes within the image blocks. Consequently, values occurring towards the end of the one-dimensional array of quantised transform coefficients tend to be zeros.

Typically, the video multiplex coder 170 represents each non-zero quantised coefficient in the one-dimensional array by two values, referred to as level and run. Level is the value of the quantised coefficient and run is the number of consecutive zero-valued coefficients preceding the coefficient in question. This process is known as "run-length coding". The run and level values for a given non-zero coefficient are ordered such that the level value precedes the associated run value. A level value equal to zero is used to indicate that there are no more non-zero coefficient values in the block. This 0-level value is referred to as an EOB (end-of-block) symbol.

The run and level values are further compressed in the video multiplex coder 170 using entropy coding. Entropy coding is a loss-less operation in which data symbols are represented by codewords. It exploits the fact that different data symbols within a data set to be coded generally have different probabilities of occurrence. Since certain values of levels and runs are more likely to occur than others, entropy coding techniques can be used effectively to reduce the number of bits required to code the run and level values representing the quantised transform coefficients.

A number of different methods can be used to implement entropy coding. One method, commonly used in video coding systems, is known as Variable Length Coding (VLC). In VLC coding each data symbol to be coded is represented by a codeword comprising a sequence of bits (i.e. 0's and 1's). Each VLC codeword is constructed so that its length corresponds to the frequency of occurrence of the symbol it represents. Thus, instead of using a fixed number of bits to represent each data symbol to be coded, a variable number of bits is assigned such that data symbols which are more likely to occur are represented by VLC codewords having fewer bits. As the lengths of the codewords may be (and generally are) different, they must also be constructed in such as to be uniquely decodable. In other words, if a valid sequence of bits having a certain finite length is received by a decoder, there should be only one possible input sequence of data symbols corresponding to the received sequence of bits. In the video encoder shown in FIG. 1, entropy coding of the run and level parameters using variable length coding may be implemented by means of look-up tables, which define the mapping between each possible data symbol in the data set to be coded and its corresponding variable length code. Such look-up tables are often defined by statistical analysis of training material comprising symbols identical to those to be coded and having similar statistical properties. It should be noted that typically the run and level values associated with a particular non-zero quantised transform coefficient are treated as a single data symbol. Thus, the VLC look-up tables used in a typical video encoder define codewords that represent particular run and level value combinations, commonly referred to as (run, level) pairs.

An alternative method of entropy coding, known as arithmetic coding, can also be used to convert the run and level values into variable length codewords. In arithmetic coding a group of data symbols, for example the run and level values for a block of quantised transform coefficients, are coded as a single floating point decimal number. This approach to entropy coding, in which a group of symbols is encoded using a single codeword, can lead to improved compression efficiency compared with methods such as variable length coding, which represent each symbol independently. Further details concerning arithmetic coding can be found from Vasudev Bhaskaran and Konstantinos Konstantinides "Image and Video Compression Standards" $2^{nd}$ Edition, Kluwer Academic Publishers, 1999, ISBN 0-7923-9952-8, Section 2.9, for example.

Once the run and level values have been entropy coded using an appropriate method, the video multiplex coder 170 further combines them with control information (e.g. 122, 123, 124 in FIG. 1), also entropy coded using a method appropriate for the kind of information in question, to form a single compressed bit-stream of coded image information 135. While entropy coding has been described in connection with operations performed by the video multiplex coder 170, it should be noted that in alternative implementations a separate entropy coding unit may be provided.

A locally decoded version of each INTRA-coded macroblock is also formed in the encoder 100. This is done by passing the quantised transform coefficients for each block of the macroblock, output by quantiser 106, through inverse quantiser 108 and applying an inverse DCT transform in inverse transformation block 110. In this way a reconstructed array of pixel values is constructed for each block of the macroblock. The resulting decoded image data is input to combiner 112. In INTRA-coding mode, switch 114 is set so that the input to the combiner 112 via switch 114 is zero. In this way, the operation performed by combiner 112 is equivalent to passing the decoded image data unaltered.

As subsequent macroblocks of the current frame are received and undergo the previously described encoding and local decoding steps in blocks 104, 106, 108, 110 and 112, a decoded version of the INTRA-coded frame is built up in frame store 120. When the last macroblock of the current frame has been INTRA-coded and subsequently decoded, the frame store 120 contains a completely decoded frame, available for use as a prediction reference frame in coding a subsequent video frame in INTER-coded format.

Operation of the encoder 100 in INTER-coding mode will now be described. In INTER-coding mode, the control manager 160 operates switch 102 to receive its input from line 117, which comprises the output of combiner 116. The combiner 116 receives the video input signal macroblock by macroblock from input 101. As combiner 116 receives the blocks of luminance and chrominance values which make up the macroblock, it forms corresponding blocks of prediction error information. The prediction error information represents the difference between the block in question and its prediction, produced in motion compensated prediction block 150. More specifically, the prediction error information for each block of the macroblock comprises a two-dimensional array of values, each of which represents the difference between a pixel value in the block of luminance or chrominance information being coded and a decoded pixel value obtained by forming a motion-compensated prediction for the block, according to the procedure described below. Thus, in a situation where each macroblock comprises, for example, an assembly of 4×4 blocks comprising luminance and chrominance values the prediction error information for each block of the macroblock similarly comprises a 4×4 array of prediction error values.

The prediction error information for each block of the macroblock is passed to DCT transformation block 104, which performs a two-dimensional discrete cosine transform on each block of prediction error values to produce a two-dimensional array of DCT transform coefficients for each block. DCT transformation block 104 produces an array of coefficient values for each prediction error block, the number of coefficient values depending on the nature of the blocks which make up the macroblock. Thus, if the fundamental block size used in the macroblock is 4×4, DCT transformation block 104 produces a 4×4 array of DCT coefficients for each prediction error block. If the block size is 8×8, an 8×8 array of DCT coefficients is produced.

The transform coefficients for each prediction error block are passed to quantiser 106 where they are quantised using a quantisation parameter QP, in a manner analogous to that described above in connection with operation of the encoder in INTRA-coding mode. Again, selection of the quantisation parameter QP is controlled by the control manager 160 via control line 115.

The quantised DCT coefficients representing the prediction error information for each block of the macroblock are passed from quantiser 106 to video multiplex coder 170, as indicated by line 125 in FIG. 1. As in INTRA-coding mode, the video multiplex coder 170 orders the transform coefficients for each prediction error block using a zigzag scanning procedure (see FIG. 4) and then represents each non-zero quantised coefficient as a level and a run value. It further compresses the run and level values using entropy coding, in a manner analogous to that described above in connection with INTRA-coding mode. Video multiplex coder 170 also receives motion vector information (described in the following) from motion field coding block 140 via line 126 and control information (122, 123, 124) from control manager 160. It entropy codes the motion vector information and control information and forms a single bit-stream of coded image information, 135 comprising the entropy coded motion vector, prediction error and control information.

The quantised DCT coefficients representing the prediction error information for each block of the macroblock are also passed from quantiser 106 to inverse quantiser 108. Here they are inverse quantised and the resulting blocks of inverse quantised DCT coefficients are applied to inverse DCT transform block 110, where they undergo inverse DCT transformation to produce locally decoded blocks of prediction error values. The locally decoded blocks of prediction error values are then input to combiner 112. In INTER-coding mode, switch 114 is set so that the combiner 112 also receives predicted pixel values, generated by motion-compensated prediction block 150. The combiner 112 combines each of the locally decoded blocks of prediction error values with a corresponding block of predicted pixel values to produce reconstructed image blocks and stores them in frame store 120.

As subsequent macroblocks of the video signal are received from the video source and undergo the previously described encoding and decoding steps in blocks 104, 106, 108, 110, 112, a decoded version of the frame is built up in frame store 120. When the last macroblock of the frame has been processed, the frame store 120 contains a completely decoded frame, available for use as a prediction reference frame in encoding a subsequently received video frame in INTER-coded format.

Formation of a prediction for a macroblock of the current frame will now be described. Any frame encoded in INTER-coded format requires a reference frame for motion-compensated prediction. This means, necessarily, that when encoding a video sequence, the first frame to be encoded, whether it is the first frame in the sequence, or some other frame, must be encoded in INTRA-coded format. This, in turn, means that when the video encoder 100 is switched into INTER-coding mode by control manager 160, a complete reference frame, formed by locally decoding a previously encoded frame, is already available in the frame store 120 of the encoder. In general, the reference frame is formed by locally decoding either an INTRA-coded frame or an INTER-coded frame.

The first step in forming a prediction for a macroblock of the current frame is performed by motion estimation block 130. The motion estimation block 130 receives the blocks of luminance values which make up the current macroblock of the frame to be coded via line 128. It then performs a block matching operation in order to identify a region in the reference frame which corresponds substantially with the current macroblock, using the luminance information. In order to perform the block matching operation, motion estimation block accesses reference frame data stored in frame store 120 via line 127. More specifically, motion estimation block 130 performs block-matching by calculating difference values (e.g. sums of absolute differences) representing the difference in luminance values between the macroblock under examination and candidate best-matching regions of pixels from a reference frame stored in the frame store 120. A difference value is produced for candidate regions at all possible offsets within a predefined search region of the reference frame and motion estimation block 130 determines the smallest calculated difference value. The offset between the macroblock in the current frame and the candidate block of pixel values in the reference frame that yields the smallest luminance component difference value defines the motion vector for the macroblock in question.

Once the motion estimation block 130 has produced a motion vector for the macroblock, it outputs the motion vector to the motion field coding block 140. The motion field coding block 140 approximates the motion vector received from motion estimation block 130 using a motion model comprising a set of basis functions and motion coefficients. More specifically, the motion field coding block 140 represents the motion vector as a set of motion coefficient values which, when multiplied by the basis functions, form an approximation of the motion vector. Typically, a translational motion model having only two motion coefficients and basis functions is used, but motion models of greater complexity may also be used.

The motion coefficients are passed from motion field coding block 140 to motion compensated prediction block 150. Motion compensated prediction block 150 also receives the best-matching candidate region of pixel values identified by motion estimation block 130 from frame store 120. Using the approximate representation of the motion vector generated by motion field coding block 140 and the pixel values of the best-matching candidate region of pixels from the reference frame, motion compensated prediction block 150 generates an array of predicted pixel values for each block of the macroblock (i.e. for each of the luminance and chrominance components). Each block of predicted pixel values is passed to combiner 116 where the predicted pixel values are subtracted from the actual (input) pixel values in the corresponding block of the current macroblock. In this way a set of prediction error blocks for the macroblock is obtained.

Operation of the video decoder 200, shown in FIG. 2 will now be described. The decoder 200 comprises a video multiplex decoder 270, which receives an encoded video bit-stream 135 from the encoder 100 and de-multiplexes it into its constituent parts, an inverse quantiser 210, an inverse DCT transformer 220, a combiner 230, a motion compensated prediction block 240, a frame store 250, a control manager 260, and an output 280.

The control manager 260 controls the operation of the decoder 200 in response to whether an INTRA- or an INTER-coded frame is being decoded. An INTRA/INTER trigger control signal, which causes the decoder to switch between decoding modes is derived, for example, from picture type information provided in a header portion of each compressed video frame received from the encoder. The INTRA/INTER trigger control signal is extracted from the encoded video bit-stream by the video multiplex decoder 270 and is passed to control manager 260 via control line 215.

Decoding of an INTRA-coded frame is performed on a macroblock-by-macroblock basis, each macroblock being decoded substantially as soon as encoded information relating to it is received in the video bit-stream 135. The video multiplex decoder 270 separates the encoded information for the blocks of the macroblock from possible control information relating to the macroblock in question. In a situation where the non-zero quantised DCT transform coefficients for each block of an INTRA-coded macroblock are entropy coded using variable length coding, the encoded information comprises variable length codewords representing the level and run values associated with the non-zero quantised DCT coefficients. The video multiplex decoder 270 decodes the variable length codewords using a variable length decoding method corresponding to the encoding method used in the encoder 100 and thereby recovers the level and run values. It then reconstructs the array of quantised transform coefficient values for each block of the macroblock and passes them to inverse quantiser 210. Any control information relating to the macroblock is also decoded in the video multiplex decoder using an appropriate decoding method and is passed to control manager 260. In particular, information relating to the level of quantisation applied to the transform coefficients is extracted from the encoded bit-stream by video multiplex decoder 270 and provided to control manager 260 via control line 217. The control manager, in turn, conveys this information to inverse quantiser 210 via control line 218. Inverse quantiser 210 inverse quantises the quantised DCT coefficients for each block of the macroblock according to the control information and provides the now inverse quantised DCT coefficients to inverse DCT transformer 220.

Inverse DCT transformer 220 performs an inverse DCT transform on the inverse quantised DCT coefficients for each block of the macroblock to form a decoded block of image information comprising reconstructed pixel values. As motion-compensated prediction is not used in the encoding/decoding of INTRA-coded macroblocks, control manager 260 controls combiner 230 in such a way that no reference information is used in the decoding of the INTRA-coded macroblock. The reconstructed pixel values for each block of the macroblock are passed to the video output 280 of the decoder where, for example, they can be provided to a display device (not shown). The reconstructed pixel values for each block of the macroblock are also stored in frame store 250. As subsequent macroblocks of the INTRA-coded frame are decoded and stored, a decoded frame is progressively assembled in the frame store 250 and thus becomes available for use as a reference frame for motion compensated prediction in connection with the decoding of subsequently received INTER-coded frames.

INTER-coded frames are also decoded macroblock by macroblock, each INTER-coded macroblock being decoded substantially as soon as encoded information relating to it is received in the bit-stream 135. The video multiplex decoder 270 separates the encoded prediction error information for each block of an INTER-coded macroblock from encoded motion vector information and possible control information relating to the macroblock in question. As explained in the foregoing, in the case where the prediction error information is entropy coded using variable length coding, the encoded prediction error information for each block of the macroblock comprises VLC codewords representing the level and run values for the non-zero quantised transform coefficients of the prediction error block in question. The video multiplex decoder 270 decodes the variable length codewords using a variable length decoding method corresponding to the encoding method used in the encoder 100 and thereby recovers the level and run values. It then reconstructs an array of quantised transform coefficient values for each prediction error block and passes them to inverse quantiser 210. Control information relating to the INTER-coded macroblock is also decoded in the video multiplex decoder 270 using an appropriate decoding method and is passed to control manager 260. Information relating to the level of quantisation applied to the transform coefficients of the prediction error blocks is extracted from the encoded bit-stream and provided to control manager 260 via control line 217. The control manager, in turn, conveys this information to inverse quantiser 210 via control line 218. Inverse quantiser 210 inverse quantises the quantised DCT coefficients representing the prediction error information for each block of the macroblock according to the control information and provides the now inverse quantised DCT coefficients to inverse DCT transformer 220. The inverse quantised DCT coefficients representing the prediction error information for each block are then inverse transformed in the inverse DCT transformer 220 to yield an array of reconstructed prediction error values for each block of the macroblock.

The encoded motion vector information associated with the macroblock is extracted from the encoded video bitstream 135 by video multiplex decoder 270 and is decoded. The decoded motion vector information thus obtained is passed to motion compensated prediction block 240, which reconstructs a motion vector for the macroblock using the same motion model as that used to encode the INTER-coded macroblock in encoder 100. The reconstructed motion vector approximates the motion vector originally determined by motion estimation block 130 of the encoder. The motion compensated prediction block 240 of the decoder uses the reconstructed motion vector to identify the location of a region of reconstructed pixels in a prediction reference frame stored in frame store 250. The reference frame may be, for example, a previously decoded INTRA-coded frame, or a previously decoded INTER-coded frame. In either case, the region of pixels indicated by the reconstructed motion vector is used to form a prediction for the macroblock in question. More specifically, the motion compensated prediction block 240 forms an array of pixel values for each block of the macroblock by copying corresponding pixel values from the region of pixels identified in the reference frame. The prediction, that is the blocks of pixel values derived from the reference frame, are passed from motion compensated prediction block 240 to combiner 230 where they are combined with the decoded prediction error information. In practice, the pixel values of each predicted block are added to corresponding reconstructed prediction error values output by inverse DCT transformer 220. In this way an array of reconstructed image pixel values for each block of the macroblock is obtained. The reconstructed pixel values are passed to the video output 280 of the decoder and are also stored in frame store 250. As subsequent macroblocks of the INTER-coded frame are decoded and stored, a decoded frame is progressively assembled in the frame store 250 and thus becomes available for use as a reference frame for motion-compensated prediction of other INTER-coded frames.

Entropy coding of the run and level values associated with the non-zero quantised transform coefficients using the technique of variable length coding (VLC) will now be examined in greater detail by means of an example. As explained in the foregoing, the two-dimensional array of quantised transform coefficients produced by transform coding and quantising a block of luminance/chrominance data (INTRA-coding mode) or prediction error data (INTER-coding mode) is first scanned using a zigzag scanning scheme to form an ordered one-dimensional array. A typical scanning order for a 4×4 array of coefficient values is illustrated in FIG. 4. It will be apparent to those skilled in the art that variations in the exact nature of the zigzag scanning order are possible. Furthermore, similar zigzag scanning schemes may also be applied to arrays of other than 4×4 coefficient values.

The ordered one-dimensional array produced as a result of the zigzag scanning operation is then examined and each non-zero coefficient is represented by a run value and a level value. As previously explained, the run value represents the number of consecutive zero coefficients preceding the coefficient in question. It thus provides an indication of the position of the non-zero coefficient in the scan. The level value is the coefficient's value. An End-Of-Block (EOB) symbol, typically a level value equal to zero, is used to indicate that there are no more non-zero coefficients in the block.

In an alternative scheme, each non-zero coefficient is represented by 3 values (run, level, last). In this representation, the level and run parameters serve the same purpose as explained in the previous paragraph. The last parameter indicates that there are no more non-zero coefficients in the scan. When this representation of the coefficients is used, a separate syntax element is used to indicate that a given block is coded and therefore there is no need for separate EOB symbol.

For the purposes of entropy coding, each (run, level) pair (or (run, level, last) triplet) is typically treated as a single symbol. Thus, VLC codewords are assigned to the different possible (run, level) pairs. A unique codeword is also assigned to the EOB symbol. Commonly, the mapping between the possible (run, level) pairs and the VLC codewords is implemented in the form of a fixed look-up table, known to (e.g. stored in) both the encoder and decoder. The VLC codewords are used to convert the symbols to a binary representation which is transmitted to the decoder and are designed in such a way as to be uniquely decodable. In practical terms this means that no VLC codeword may be the prefix for any other codeword.

Table 1 is a look-up table of the type just described, showing an exemplary mapping between specific (run, level) pairs and VLC codewords. In the example presented in Table 1 the EOB symbol is assigned the shortest codeword.

TABLE 1

Exemplary mapping between (run, level) pairs and VLC codewords

| Run | Level | codeword index | VLC codeword |
|---|---|---|---|
| — | EOB | 0 | 1 |
| 0 | 1 | 1 | 001 |
| 0 | −1 | 2 | 011 |
| 1 | 1 | 3 | 00001 |
| 1 | −1 | 4 | 00011 |
| 2 | 1 | 5 | 01001 |
| 2 | −1 | 6 | 01011 |
| 0 | 2 | 7 | 0000001 |
| 0 | −2 | 8 | 0000011 |
| 3 | 1 | 9 | 0001001 |
| 3 | −1 | 10 | 0001011 |
| 4 | 1 | 11 | 0100001 |
| 4 | −1 | 12 | 0100011 |
| ... | ... | ... | ... |

FIG. 5 shows an example of a 4×4 array of quantised transform coefficients, such as that generated in a video encoder for an image block in INTRA-coding mode or a block of prediction error values in INTER-coding mode. After applying the zigzag scanning scheme shown in FIG. 4, the ordered one-dimensional sequence of quantised coefficients thus produced has the following elements:

0, 1, 2, 0, 0, 0, −1, 0, 0, 0, 0, 0, 0, 0, 0, 0

This sequence can further be represented as the following set of (run, level) pairs, terminated with an EOB symbol:

(1, 1), (0, 2), (3, −1), EOB.

Applying the mapping between (run, level) pairs and VLC codewords given in Table 1, the following sequence of bits is generated:

00001|0000001|0001011|1

As mentioned above, this is the binary representation of the quantised transform coefficients transmitted in the bit-stream from the encoder to the decoder. In order to correctly decode the bit-stream, the decoder is aware of the mapping between VLC codewords and the (run, level) pairs. In other words, both encoder and decoder use the same set of VLC codewords and the same assignment of symbols to VLC codewords.

In order to maximise the compression provided by variable length coding, those symbols which occur most frequently in the data to be coded should be assigned the shortest VLC codewords. However, in image coding, the frequency of occurrence (i.e. probability) of different transform coefficients, and hence the probability of different (run, level) pairs, changes depending on the image content and the type of the image being encoded. Thus, if a single set of variable length codewords is used and only a single mapping between the data symbols to be encoded/decoded and the VLCs is provided, in general, optimum coding efficiency cannot be achieved.

One solution to this problem is to use different VLC codewords and data symbol to codeword mappings and to transmit the variable length codewords and their assignment to the different data symbols as a part of the bit-stream. This possibility is included in the international still image compression standard ISO/IEC 10918-1 "Digital Compression and Coding of Continuous-Tone Still Images"/ITU-T recommendation T.81 developed by the Joint Photographic Expert Group and commonly referred to as the JPEG image coding standard. If this option is employed, the probabilities of different data symbols, for example the probabilities of different (run, level) pairs associated with quantised DCT coefficients, are calculated for each image to be coded. This information is then used to create the VLC codewords and to define the mapping between the data symbols (e.g. (run, level) pairs) and the codewords. The codewords and the mapping information are, for example, included in the compressed file for a given image and are transmitted in the bit-stream from the encoder to the decoder.

This solution allows the codewords and the mappings between the codewords and the data symbols to be constructed in a way that is adaptive to the nature/content of the image to be coded. In this way a level of data compression can be achieved which generally exceeds that which could be attained if fixed codewords and mappings were used. However, this approach has a number of technical disadvantages, which make it unsuitable for use in video applications. More specifically, a significant delay is introduced, as each image, or each part thereof, requires pre-processing before any of the image data can be encoded and transmitted. Furthermore, a large number of bits is required to specify information about the variable length codewords and their assignment to the data symbols.

Additionally, error resilience is a significant problem. If information relating to the codewords, or the mapping between the codewords and the data symbols, is lost or has residual errors after undergoing error correction at the decoder, the bit-stream comprising the encoded image data cannot be decoded correctly.

In an alternative technique aimed at improving the data compression provided by variable length coding, known as adaptive VLC coding, initial VLC codes and mappings are calculated in both the encoder and the decoder based on a priori symbol probability estimates. In image coding applications these probability estimates may be calculated in advance, for example using a database of so-called 'training' images representative or typical of those to be encoded and transmitted. Subsequently, the symbol probability estimates are updated in the encoder and decoder as further encoded data symbols are transmitted. Using the updated probability estimates, the encoder and decoder re-calculate the VLC codewords and their assignments. This re-calculation may be performed very frequently, for example after receiving each new symbol. The main drawbacks of this method are high computational complexity (particularly if the probability estimates are re-calculated very frequently) and poor error resilience. Incorrect decoding of one symbol causes a mismatch between the encoder and decoder symbol counts causing the VLC codes designed in the encoder and decoder to differ from that point onwards. This means that the probability counts should be reset at frequent intervals and this tends to decrease the coding efficiency achieved by using this method.

ITU-T video coding recommendation H.26L proposes the use of a so-called "universal" variable length coding scheme, referred to as UVLC (see ITU-T Q.15/SG16 "H.26L Test Model Long Term Number 5 (TML-5) draft 0", Doc. Q15-K-59, October 2000, Section 2.4.1). Accordingly, a video encoder implemented according to H.26L TML-5 uses a single set of variable length codewords to entropy code all information (syntax elements) to be transmitted in the bit-stream from the encoder. While the codewords used are the same, a predetermined number of different data-symbol-to-codeword mappings are defined for the coding of different types of information. For example, two data-symbol-to-codeword mappings are provided for blocks containing luminance information, the choice of mapping depending on the type of zigzag scanning operation (simple or double scan) used to order the quantised DCT transform coefficients. For details of the simple and double scan zigzag scanning schemes defined according to H.26L, see Q.15/SG16 "H.26L Test Model Long Term Number 5 (TML-5) draft 0", Doc. Q15-K-59, October 2000, Sections 3.4.1 and 3.4.2. Different mappings are also provided for macroblock type (MB_Type) information, motion vector data (MVD) and INTRA-prediction mode information, among others (see Table 4, below).

The UVLC codewords defined in H.26L TML-5 may be written in the following compressed form, shown in Table 2 below, where the $x_n$ terms can take either the value 0 or 1:

TABLE 2

Scheme for Generation of UVLC Codewords According to H.26L 1
0 $x_0$ 1
0 $x_1$ 0 $x_0$ 1
0 $x_2$ 0 $x_1$ 0 $x_0$ 1
0 $x_3$ 0 $x_2$ 0 $x_1$ 0 $x_0$ 1

Table 3 presents the first 16 UVLC codewords, generated according to the scheme presented in Table 2, while Table 4 shows some of the different data-symbol-to-codeword mappings provided according to H.26L. For a complete description of the mappings, the reader should refer to Q.15/SG16 "H.26L Test Model Long Term Number 5 (TML-5) draft 0", Doc. Q15-K-59, October 2000, Section 2.4.1.

TABLE 3

The First 16 UVLC Codewords of H.26L Generated According to the Scheme Presented in Table 2

| codeword index | VLC codeword |
|---|---|
| 0 | 1 |
| 1 | 001 |
| 2 | 011 |
| 3 | 00001 |
| 4 | 00011 |
| 5 | 01001 |
| 6 | 01011 |
| 7 | 0000001 |
| 8 | 0000011 |
| 9 | 0001001 |
| 10 | 0001011 |
| 11 | 0100001 |
| 12 | 0100011 |
| 13 | 0101001 |
| 14 | 0101011 |
| 15 | 000000001 |
| ... | ... |

TABLE 4

Example Data-Symbol-to-UVLC-Codeword Mappings as Defined in H.26L TML-5

| Code_number | MB_Type INTRA | MB_Type INTER | INTRA_prediction_mode Prob0 | INTRA_prediction_mode Prob1 | MVD | Tcoeff_chroma_AC Tcoeff_luma Simple scan Level | Tcoeff_chroma_AC Tcoeff_luma Simple scan Run | Tcoeff_luma Double scan Level | Tcoeff_luma Double scan Run |
|---|---|---|---|---|---|---|---|---|---|
| 0 | Intra4 × 4 | Skip | 0 | 0 | 0 | EOB | — | EOB | — |
| 1 | 0, 0, 0$^3$ | 16 × 16 | 1 | 0 | 1 | 1 | 0 | 1 | 0 |
| 2 | 1, 0, 0 | 8 × 8 | 0 | 1 | −1 | −1 | 0 | −1 | 0 |
| 3 | 2, 0, 0 | 16 × 8 | 0 | 2 | 2 | 1 | 1 | 1 | 1 |
| 4 | 3, 0, 0 | 8 × 16 | 1 | 1 | −2 | −1 | 1 | −1 | 1 |
| 5 | 0, 1, 0 | 8 × 4 | 2 | 0 | 3 | 1 | 2 | 2 | 0 |
| 6 | 1, 1, 0 | 4 × 8 | 3 | 0 | −3 | −1 | 2 | −2 | 0 |
| 7 | 2, 1, 0 | 4 × 4 | 2 | 1 | 4 | 2 | 0 | 1 | 2 |
| 8 | 3, 1, 0 | Intra4 × 4 | 1 | 2 | −4 | −2 | 0 | −1 | 2 |
| 9 | 0, 2, 0 | 0, 0, 0$^3$ | 0 | 3 | 5 | 1 | 3 | 3 | 0 |
| 10 | 1, 2, 0 | 1, 0, 0 | 0 | 4 | −5 | −1 | 3 | −3 | 0 |
| 11 | 2, 2, 0 | 2, 0, 0 | 1 | 3 | 6 | 1 | 4 | 4 | 0 |
| 12 | 3, 2, 0 | 3, 0, 0 | 2 | 2 | −6 | −1 | 4 | −4 | 0 |
| 13 | 0, 0, 1 | 0, 1, 0 | 3 | 1 | 7 | 1 | 5 | 5 | 0 |
| 14 | 1, 0, 1 | 1, 1, 0 | 4 | 0 | −7 | −1 | 5 | −5 | 0 |
| 15 | 2, 0, 1 | 2, 1, 0 | 5 | 0 | 8 | 3 | 0 | 1 | 3 |
| 16 | 3, 0, 1 | 3, 1, 0 | 4 | 1 | −8 | −3 | 0 | −1 | 3 |
| 17 | 0, 1, 1 | 0, 2, 0 | 3 | 2 | 9 | 2 | 1 | 1 | 4 |
| 18 | 1, 1, 1 | 1, 2, 0 | 2 | 3 | −9 | −2 | 1 | −1 | 4 |
| 19 | 2, 1, 1 | 2, 2, 0 | 1 | 4 | 10 | 2 | 2 | 2 | 1 |
| 20 | 3, 1, 1 | 3, 2, 0 | 0 | 5 | −10 | −2 | 2 | −2 | 1 |
| 21 | 0, 2, 1 | 0, 0, 1 | 1 | 5 | 11 | 1 | 6 | 3 | 1 |
| 22 | 1, 2, 1 | 1, 0, 1 | 2 | 4 | −11 | −1 | 6 | −3 | 1 |
| 23 | 2, 2, 1 | 2, 0, 1 | 3 | 3 | 12 | 1 | 7 | 6 | 0 |
| 24 | 3, 2, 1 | 3, 0, 1 | 4 | 2 | −12 | −1 | 7 | −6 | 0 |
| 25 | | 0, 1, 1 | 5 | 1 | 13 | 1 | 8 | 7 | 0 |
| 26 | | 1, 1, 1 | 5 | 2 | −13 | −1 | 8 | −7 | 0 |
| 27 | | 2, 1, 1 | 4 | 3 | 14 | 1 | 9 | 8 | 0 |
| 28 | | 3, 1, 1 | 3 | 4 | −14 | −1 | 9 | −8 | 0 |
| 29 | | 0, 2, 1 | 2 | 5 | 15 | 4 | 0 | 9 | 0 |

TABLE 4-continued

Example Data-Symbol-to-UVLC-Codeword Mappings as Defined in H.26L TML-5

| Code_ number | MB_Type INTRA | MB_Type INTER | INTRA_ prediction_ mode Prob0 | INTRA_ prediction_ mode Prob1 | MVD | Tcoeff_chroma_AC Tcoeff_luma Simple scan Level | Tcoeff_chroma_AC Tcoeff_luma Simple scan Run | Tcoeff_luma Double scan Level | Tcoeff_luma Double scan Run |
|---|---|---|---|---|---|---|---|---|---|
| 30 | | 1, 2, 1 | 3 | 5 | −15 | −4 | 0 | −9 | 0 |
| 31 | | 2, 2, 1 | 4 | 4 | 16 | 5 | 0 | 10 | 0 |
| 32 | | 3, 2, 1 | 5 | 3 | −16 | −5 | 0 | −10 | 0 |
| 33 | | | 5 | 4 | 17 | 3 | 1 | 4 | 1 |
| 34 | | | 4 | 5 | −17 | −3 | 1 | −4 | 1 |
| 35 | | | 5 | 5 | 18 | 3 | 2 | 2 | 2 |
| 36 | | | | | −18 | −3 | 2 | −2 | 2 |
| 37 | | | | | 19 | 2 | 3 | 2 | 3 |
| 38 | | | | | −19 | −2 | 3 | −2 | 3 |
| 39 | | | | | 20 | 2 | 4 | 2 | 4 |
| 40 | | | | | −20 | −2 | 4 | −2 | 4 |
| 41 | | | | | 21 | 2 | 5 | 2 | 5 |
| 42 | | | | | −21 | −2 | 5 | −2 | 5 |
| 43 | | | | | 22 | 2 | 6 | 2 | 6 |
| 44 | | | | | −22 | −2 | 6 | −2 | 6 |
| 45 | | | | | 23 | 2 | 7 | 2 | 7 |
| 46 | | | | | −23 | −2 | 7 | −2 | 7 |
| 47 | | | | | 24 | 2 | 8 | 11 | 0 |
| ... | | | | | | ... | | ........ | .... |

The universal variable length coding scheme adopted in H.26L provides a number of technical advantages. In particular, use of a single set of VLC codewords, which can be constructed according to a simple rule, such as that presented in Table 2, enables codewords to be created bit-by-bit. This obviates the need for storage of a codeword table in the encoder and decoder and thus reduces the memory requirements of both the encoder and decoder. It should be noted, of course, that in alternative implementations, codeword tables may be generated and stored in the encoder and decoder. The different data-symbol-to-codeword mappings allow at least limited adaptation of the UVLC coding scheme to the different statistical properties of the various types of image-related data and control information that are entropy coded. The various data-symbol-to-codeword mappings can be stored in the encoder and decoder and thus there is no need to transmit the mapping information in the bit-stream from encoder to decoder. This helps maintain error resilience.

The UVLC entropy coding scheme does, however, also suffer from some disadvantages. In particular, the fixed codewords and the limited degree of adaptability provided by the different data-symbol-to-codeword mappings, inevitably result in less than optimum data compression. For this reason modifications of the basic UVLC coding scheme have been proposed. More specifically, it has been suggested to include more than one set of VLC codewords. One such proposal was made by Gisle Bjontegaard in Q.15/SG16 "Use of Adaptive Switching Between Two VLCs for INTRA Luma Coefficients", Doc. Q15-K-30, August 2000. This proposal suggested the use of a second set of VLC codewords for the entropy coding of certain types of information. According to document Q15-K-30, the proposed second set of VLC codewords, referred to as VLC2, is constructed according to the scheme shown below in Table 5. It is used in particular to code the run and level values associated with quantised transform coefficients of 4×4 pixel INTRA-coded luminance blocks scanned using the double scan zigzag scanning scheme defined according to H.26L. Table 6 shows, in explicit form, the first 12 codewords of VLC2.

TABLE 5

Scheme for Generation of VLC2 Codewords According to Q.15/SG16 Document Q15-K-30

1 0
1 1 0
1 1 1
0 $x_1$ 1 $x_0$
0 $x_2$ 0 $x_1$ 1 $x_0$
0 $x_3$ 0 $x_2$ 0 $x_1$ 1 $x_0$

TABLE 6

The First 16 VLC2 Codewords of Q.15/SG16 Document Q15-K-30, Generated According to the Scheme Presented in Table 5

| Codeword Index | VLC2 codeword |
|---|---|
| 0 | 10 |
| 1 | 110 |
| 2 | 111 |
| 3 | 0010 |
| 4 | 0011 |
| 5 | 0110 |
| 6 | 0111 |
| 7 | 000010 |
| 8 | 000011 |
| 9 | 000110 |
| 10 | 000111 |
| 11 | 010010 |
| 12 | 010011 |
| 13 | 010110 |
| 14 | 010111 |
| 15 | 00000010 |

As can be seen by comparing Tables 5 and 6 with Tables 2 and 3 respectively, the shortest codeword of VLC2 has two bits as opposed to the single bit allocated to the shortest codeword in the original set of UVLC codewords. Due to general decodability requirement that no VLC codeword may be a prefix of any other, this change has a significant effect on the structure of the other VLC2 codewords. In particular, assigning two bits to the shortest codeword enables codewords having higher indices to be represented with fewer bits. For example, referring to table 3, it can be seen that the UVLC codeword with index 7 has 7 bits, while the VLC2 codeword with index 7 has only 6 bits. As the previous example depicts, VLC2 has shorter codeword lengths for higher indexes. Therefore, VLC2 codewords are generally better suited to the entropy coding of data symbols which, on average, have larger index values.

As previously stated, Q.15/SG16 document Q15-K-30, proposed that the VLC2 codewords should be used to entropy code the run and level values associated with 4×4 pixel luminance blocks of INTRA-coded macroblocks. It further proposed an adaptive mechanism for switching between the use of UVLC and VLC2 codewords. The proposed adaptive switching mechanism operates according to the following rules:

1). The (run, level) pair associated with the first non-zero coefficient of a 4×4 luminance block in an INTRA-coded macroblock is coded using a codeword from the set of UVLC codewords.

2). The (run, level) pairs associated with the first non-zero coefficients of the remaining 4×4 blocks in the macroblock are coded using codewords from the set of VLC2 codewords if the absolute value of the level for the DC coefficient in the previously coded 4×4 block is greater than 1. If this condition is not met, a codeword from the set of UVLC codewords is used.

3). The remaining non-zero coefficients in a 4×4 block are represented by codewords from the set of UVLC codewords if ABS(level)/(run+2)<1 for the previously coded non-zero coefficient. Otherwise a codeword from the set of VLC2 codewords is used.

The adaptive VLC coding mechanism for INTRA-coded luminance blocks, as proposed in Q.15/SG16 document Q15-K-30, is illustrated schematically in the flowchart of FIG. 5. The process is entered at step 500, when run and level values associated with the 4×4 pixel luminance blocks of an INTRA-coded macroblock become available for entropy (variable length) coding. At step 502 a block counter is initialised to zero. Next, at step 504 the block counter is incremented and at step 506 a check is performed to determine whether the newly incremented block counter value is greater than the number of luminance blocks in the macroblock. If the condition at step 506 is fulfilled, all the luminance blocks of the current macroblock have been VLC coded and the process exits (step 508). Typically, at this point, the run and level values associated with the chrominance blocks of the macroblock are VLC coded. The process illustrated in FIG. 5 is then re-entered at step 500 when run and level values associated with the luminance blocks of a subsequent INTRA-coded macroblock become available for variable length coding. If the condition at step 506 is not fulfilled, this means that at least one luminance block of the current macroblock remains to be variable length coded. In this case, the next luminance block is selected and the process continues to step 510. At step 510 a check is performed to determine if the data for the next luminance block comprises any non-zero coefficients. In practical terms this means that a check is preformed to determine whether the data for the block contains any (run, level) pairs to be VLC coded. If the luminance block contains no non-zero coefficients (there are no (run, level) pairs to be coded), the process returns to step 504, the block counter is incremented and the next luminance block is selected. If there is at least one (run, level) pair to be VLC coded, the process continues to step 512.

Step 512 checks whether the newly selected block is the first luminance block of the macroblock. If it is, branch (1) is entered, otherwise, the process follows branch (2). Assuming that the current block is the first to be coded, the next step in the process is 514, where the first (run, level) pair of the block is selected. At step 516, the first (run, level) pair is VLC coded using a codeword from the set of UVLC codewords. The process then proceeds to step 526. If the current block is not the first block to be coded, the first (run, level) pair of the block is selected at step 518 and the process proceeds to step 520. At step 520 it is determined whether the magnitude of the level value associated with the DC coefficient of the previously coded block is greater than 1. If it is not, the process continues to step 522, where the first (run, level) pair of the current block is represented using a codeword selected from the set of UVLC codewords. If, on the other hand, the condition at step 520 is satisfied, step 524 is entered and the first (run, level) pair of the current block is VLC coded using a codeword from the set of VLC2 codewords.

After steps 522/524, the process continues with step 526, where a check is performed to determine whether the (run, level) pair just coded is the last (run, level) pair of the current block. If the (run, level) pair just coded is the last (run, level) pair of the block, the process returns to step 504, where the block counter is again incremented. If the (run, level) in question is not the last in the current block, the process continues to step 528 where the next (run, level) pair is selected. Step 530 is then entered. Here the previously coded (run, level) pair is examined and a value determined by the expression ABS(level)/(run+2) is calculated using the run and level values of the previous (run, level) pair. If ABS (level)/(run+2) for the previously coded (run, level) pair is less than 1, step 534 is executed and the current (run, level) pair is VLC coded using a codeword selected from the set of UVLC codewords. If ABS(level)/(run+2) for the previously coded (run, level) pair is not less than 1, the process continues to step 532 and the current (run, level) pair is VLC coded using a codeword selected from the set of VLC2 codewords. The process then returns to step 526 and the loop comprising steps 526, 528, 530, 532 and 534 is repeated until the condition at step 526 is true i.e. all the (run, level) pairs for the current block have been VLC coded. The process then returns to step 504 and selects the next block of INTRA-coded luminance data to be processed.

As explained above, Q.15/SG16 document Q15-K-30 demonstrated that improvements in data compression for INTRA-coded macroblocks could be achieved by switching between two sets of VLC codewords, namely the original set of UVLC codewords and the new VLC2 codeword set. However, the aforementioned proposal departed from the Universal-VLC approach already adopted in H.26L, as the codewords in the UVLC and VLC2 codeword sets formed two distinct codeword families. Therefore, it was not approved for use in connection with the H.26L video coding recommendation. Instead, an alternative proposal was made, the details of which can be found in Q.6/SG16 document VCEG-L28, "VLC Concatenation for INTRA Coding", January, 2001. Like the method proposed in Q.15/SG16 document Q15-K-30, Q.6/SG16 document VCEG-L28 suggests the use of more than one set of VLC codewords in order to improve the data compression efficiency achieved in the coding of luminance data for INTRA-coded macroblocks. However, in this case the codewords of the different codeword set(s) do not constitute separate codeword families, but are related to each other. More specifically, Q.6/SG16 document VCEG-L28 shows how different codeword sets can be constructed by concatenating (joining together) UVLC codewords. This approach provides the possibility to construct more than one additional set of VLC codewords and can be viewed as providing alternative interpretations of an original H.26L bit-stream.

According to Q.6/SG16 document VCEG-L28, a first additional set of VLC codewords, referred to as UVLC2, is constructed using the shortest original UVLC codeword "1" as a prefix for certain of the other codewords in the set. So that all the codewords can be distinguished uniquely from each other, the codeword having index 0 must be given the prefix "1". This means that the 0 index codeword in the set of UVLC2 codewords is "11" and thus the shortest codeword in the UVLC2 codeword set has two bits. In this way, the set of UVLC2 codewords requires one extra bit to code the data symbol corresponding to the codeword with index 0. However, as can be seen from Table 7 below, for all other codeword indices the number of bits required is up to two bits less than that required when using the original set of UVLC codewords. This provides a significant increase in data compression efficiency.

Referring to Table 7 and looking in more detail at the UVLC2 codewords with indices greater than 0, it can be seen that each of the codewords is either a) a UVLC codeword or b) a combination of two UVLC codewords, the first of which is always "1". The UVLC2 codewords are constructed as shown in Table 7 by dividing the UVLC codewords into groups having fixed numbers of bits. For example, all UVLC codewords having 3 bits are assigned to one group, all codewords having 5 bits are assigned to another group and so on. The 3-bit UVLC codewords are copied into the set of UVLC2 codewords in index number order and are followed by a group of modified codewords which are derived by taking each of the 3-bit codewords in index number order and adding the shortest UVLC codeword, namely "1", as a prefix. Thus, when viewed in index number order, the last three bits of the group of modified codewords are identical to those of the group of 3-bit codewords. The process of copying UVLC codewords and inserting groups of identical codewords having the prefix "1" is repeated for the group of 5-bit UVLC codewords and all subsequent groups having larger numbers of bits, as illustrated in Table 7. In this way a complete set of UVLC2 codewords is generated.

The same principle can be used to construct further additional sets of VLC codewords. For example, it is possible to construct a second additional set of codewords, referred to as UVLC3, which comprises original UVLC codewords with zero, one or two prefixes (each of which is a "1"). Table 8 illustrates the set of UVLC3 codewords.

TABLE 7

The Relationship Between UVLC and UVLC2 Codewords

| Index | UVLC | UVLC2 |
|---|---|---|
| 0 | 1 | 11 |
| 1 | 001 | 001 |
| 2 | 011 | 011 |
| 3 | 00001 | 1001 |
| 4 | 00011 | 1011 |
| 5 | 01001 | 00001 |
| 6 | 01011 | 00011 |
| 7 | 0000001 | 01001 |
| 8 | 0000011 | 01011 |
| 9 | 0001001 | 100001 |
| 10 | 0001011 | 100011 |
| 11 | 0100001 | 101001 |
| 12 | 0100011 | 101011 |
| 13 | 0101001 | 0000001 |
| 14 | 0101011 | 0000011 |
| 15 | 000000001 | 0001001 |
| 16 | 000000011 | 0001011 |
| 17 | 000001001 | 0100001 |
| 18 | 000001011 | 0100011 |
| 19 | 000100001 | 0101001 |
| 20 | 000100011 | 0101011 |
| 21 | 000101001 | 10000001 |
| 22 | 000101011 | 10000011 |
| 23 | 010000001 | 10001001 |
| 24 | 010000011 | 10001011 |
| 25 | 010001001 | 10100001 |
| 26 | 010001011 | 10100011 |
| 27 | 010100001 | 10101001 |
| 28 | 010100011 | 10101011 |
| 29 | 010101001 | 000000001 |
| 30 | 010101011 | 000000011 |

TABLE 8

The Relationship Between UVLC3 and UVLC Codewords

| Index | UVLC | UVLC3 |
|---|---|---|
| 0 | 1 | 111 |
| 1 | 001 | 001 |
| 2 | 011 | 011 |
| 3 | 00001 | 1001 |
| 4 | 00011 | 1011 |
| 5 | 01001 | 11001 |
| 6 | 01011 | 11011 |
| 7 | 0000001 | 00001 |
| 8 | 0000011 | 00011 |
| 9 | 0001001 | 01001 |
| 10 | 0001011 | 01011 |

TABLE 8-continued

The Relationship Between UVLC3 and UVLC Codewords

| 11 | 0100001 | 100001 |
|---|---|---|
| 12 | 0100011 | 100011 |
| 13 | 0101001 | 101001 |
| 14 | 0101011 | 101011 |
| 15 | 000000001 | 1100001 |
| 16 | 000000011 | 1100011 |
| 17 | 000001001 | 1101001 |
| 18 | 000001011 | 1101011 |
| 19 | 000100001 | 0000001 |
| 20 | 000100011 | 0000011 |
| 21 | 000101001 | 0001001 |
| 22 | 000101011 | 0001011 |
| 23 | 010000001 | 0100001 |
| 24 | 010000011 | 0100011 |
| 25 | 010001001 | 0101001 |
| 26 | 010001011 | 0101011 |
| 27 | 010100001 | 10000001 |
| 28 | 010100011 | 10000011 |
| 29 | 010101001 | 10001001 |
| 30 | 010101011 | 10001011 |

As in the case of the VLC2 codewords previously described, according to Q.6/SG16 document VCEG-L28, the use of UVLC2 codewords (and potentially UVLC3 codewords) is suggested in particular for the entropy coding of (run, level) pairs associated with the quantised transform coefficients of INTRA-coded luminance blocks scanned using the double scan zigzag scanning scheme defined according to H.26L. Q.6/SG16 document VCEG-L28 defines the following rules for coding the (run, level) pairs:

1). The first non-zero coefficient (i.e. (run, level) pair) of the first scan is VLC coded using a codeword from the set of UVLC2 codewords, if the block immediately above or to the left of the block being coded is unavailable or the condition ABS(DC_above)+ABS (DC_left)>2 is satisfied. The term DC_above refers to the level value of the DC (first) coefficient in the block immediately above the block being coded, DC_left refers to the level value of the DC coefficient of the block immediately to the left of the block being coded and the values DC_above=1 and DC_left=1 are used if the neighbouring blocks in question are outside the current macroblock. Otherwise a codeword from the set of UVLC codewords is used.

2). The first non-zero coefficient (i.e. (run, level) pair) of the second scan is VLC coded using a codeword from the set of UVLC2 codewords if the condition ABS(DC) >2 is satisfied or if the first scan had more than 3 non-zero coefficients, where the term DC denotes the level value of the DC (first) coefficient of the block being VLC coded. Otherwise a codeword from the set of UVLC codewords is used.

3). The second non-zero coefficient (i.e. (run, level) pair) of the first scan is VLC coded using a codeword from the set UVLC2 codewords if the condition ABS (previous_level)>2, where the term previous_level refers to the level value of the previously coded (run, level) pair. Otherwise a codeword from the set of UVLC codewords is used.

4). The second non-zero coefficient (i.e. (run, level) pair) of the second scan is VLC coded using a codeword from the set of UVLC2 codewords if the condition ABS(previous_level)>1, where the term previous_ level refers to the level value of the previously coded (run, level) pair. Otherwise a codeword from the set of UVLC codewords is used.

5). The third through sixth non-zero coefficients (i.e. (run, level) pairs) are VLC coded using a codeword from the set of UVLC2 codewords if the condition ABS (previous_level)/(previous_run+2)>0 is fulfilled.

6). Otherwise a codeword from the set of UVLC codewords is used.

Both the previously described prior art methods of VLC coding, in which codewords are selected by context-based switching between more than one set of codewords, provide an improvement in data compression efficiency compared with methods in which a single set of VLC codewords is used. However, in general this is achieved at the expense of additional computational complexity. In many data compression applications and particularly in applications related to low bit-rate video coding, there is a continuing desire to improve data compression efficiency. Thus, there is still considerable interest in the development of new methods of variable length coding which provide improved adaptability to the type and statistical properties of the data symbols to be coded while maintaining low computational complexity, low memory requirements and good error resilience. It is in this context that the method according to the present invention has been developed.

SUMMARY OF THE INVENTION

The object of the present invention is to provide a method of VLC coding with improved data compression efficiency compared with the previously described prior art methods, while maintaining low computational complexity and good error resilience. It is a form of context-based variable length coding, which adapts to the nature of the data to be coded. More specifically, it involves the use of at least two sets of VLC codewords and defines rules for switching between the sets of codewords, which take into account the values of previously encoded data symbols. This approach helps to provide improved data compression efficiency is obtained compared with VLC coding methods that use fixed codeword tables, for example. The switching rules are designed so that a bit-stream comprising VLC codewords formed according to the inventive method can be decoded without requiring any information relating to the choice of codewords to be included in the bit-stream. In other words, there is no need to provide an explicit indication of the set from which each codeword in the bit-stream was chosen. This property also enhances data compression efficiency.

Accordingly, and in a first aspect, there is provided a method of variable length coding data symbols. The data symbols are arranged in a number of sets, each of which comprises at least a first data symbol. At least two sets of variable length codewords are provided for variable length coding the data symbols and the sets of data symbols are variable length coded in a coding sequence, starting from a first set and progressing to a last set of data symbols. The method is characterised in that for a given set of data symbols, other than the first set of data symbols in the coding sequence, a set of cumulative information measures is determined, each of which is representative of a total amount of information required to variable length code the first data symbols of all the sets of data symbols preceding the given set of data symbols in the coding sequence using a predetermined one of the at least two sets of variable length codewords. The set of cumulative information measures is examined to determine which of the at least two sets of variable length codewords provides the smallest cumulative information measure and a codeword is selected to variable length code the first data symbol of the given set of data symbols from the set of variable length codewords which provides the smallest cumulative information measure.

Preferably, the set of cumulative information measures is maintained as a set of running totals.

Preferably, the method further comprises variable length coding a data symbol other than the first data symbol of a set of data symbols using a codeword selected from one of the at least two sets of variable length codewords responsive to a value of another data symbol in the set of data symbols. Even more preferably, a data symbol other than the first data symbol of a set of data symbols is variable length coded using a codeword selected from one of the at least two sets of variable length codewords responsive to a value of a previously coded data symbol in the set of data symbols.

Advantageously, the first data symbol of the first set of data symbols in the coding sequence is variable length coded using a codeword selected from a predetermined one of the at least two sets of variable length codewords.

Preferably, each of the at least two sets of variable length codewords comprises a number of variable length codewords and a set of unique mappings between said data symbols and said variable length codewords.

Preferably, at least some of the variable length codewords comprised by one of the at least two sets of variable length codewords are different from those of another of the at least two sets of variable length codewords. Alternatively, each of the sets of variable length codewords comprises the same variable length codewords, and different mappings between the data symbols and the variable length codewords are provided. Most preferably, at least some of the variable length codewords comprised by one of the at least two sets of variable length codewords are combinations of variable length codewords comprised by another of said at least two sets of variable length codewords.

In one embodiment, the method of variable length coding according to the invention is implemented in a video encoder and is applied to the variable length coding of data symbols that are representative of transform coefficient values. In this case, the data symbols are preferably pairs of values, a first value of each pair representing a non-zero-valued coefficient and a second value of each pair representing a number of zero-valued coefficients preceding or following the non-zero-valued coefficient. In this advantageous embodiment of the invention, a data symbol in a set of data symbols is variable length coded using a codeword selected from one of the at least two sets of variable length codewords responsive to one of the first value, the second value, or both the first and the second value of another data symbol in the set of data symbols. Even more advantageously, the choice of codeword is made responsive to the first, the second or both the first and the second values of a previously coded data symbol in the set of data symbols.

Advantageously, the method according to the invention further comprises forming a bit-stream including variable length coded data symbols.

According to a second aspect of the invention, there is provided an encoder for variable length coding data symbols. The data symbols are arranged in a number of sets of data symbols, each set of data symbols comprising at least a first data symbol. At least two sets of variable length codewords are provided for variable length coding the data symbols and the encoder is arranged to variable length code the sets of data symbols in a coding sequence, starting from a first set of data symbols and progressing to a last set of data symbols. The encoder is characterised in that it includes means for processing a given set of data symbols other than the first set of data symbols in the coding sequence, to determine a set of cumulative information measures, each of which is representative of a total amount of information required to variable length code the first data symbols of all the sets of data symbols preceding the given set of data symbols in the coding sequence using a predetermined one of the at least two sets of variable length codewords. The encoder further includes means for examining the set of cumulative information measures to determine which of the at least two sets of variable length codewords provides the smallest cumulative information measure and means for selecting a codeword for variable length coding the first data symbol of the given set of data symbols from the set of variable length codewords which provides the smallest cumulative information measure.

Preferably, the encoder further includes means for maintaining the set of cumulative information measures as a set of running totals.

Preferably, the encoder further includes means for variable length coding a data symbol other than the first data symbol of a set of data symbols using a codeword from a selected one of the at least two sets of variable length codewords, said means being arranged to choose the selected one of the at least two sets of variable length codewords responsive to a value of another data symbol in the set of data symbols. Even more preferably, said means is arranged to choose the selected one of the at least two sets of variable length codewords responsive to a value of a previously coded data symbol in the set of data symbols.

Advantageously, the encoder is arranged to variable length code the first data symbol of the first set of data symbols in the coding sequence using a codeword selected from predetermined one of the at least two sets of variable length codewords.

In one embodiment, the encoder is implemented in a video encoder and is used in the variable length coding of data symbols that are representative of transform coefficient values. In this case, the data symbols are preferably pairs of values, a first value of each pair representing a non-zero-valued coefficient and a second value of each pair representing of a number of zero-valued coefficients preceding or following the non-zero-valued coefficient. In this advantageous embodiment of the invention, the encoder includes means for variable length coding a data symbol in a set of data symbols using a codeword from a selected one of the at least two sets of variable length codewords responsive to one of the first value, the second value, or both the first and the second value of another data symbol in the set of data symbols. Even more advantageously, the encoder includes means for choosing a codeword responsive to the first, the second or both the first and the second values of a previously coded data symbol in the set of data symbols.

Advantageously, the encoder further includes means for forming a bit-stream including variable length coded data symbols.

Most preferably, the encoder is implemented in a mobile communications device, such as a mobile telephone or radio card, which can be connected, for example, to a personal computer in order to provide the device with radio communication functionality.

According to a third aspect of the invention, there is provided a method of variable length decoding, comprising receiving a stream of variable length codewords representative of data symbols, the data symbols being arranged in a number of sets of data symbols, each set of data symbols comprising at least a first data symbol, and having been variable length coded using variable length codewords selected from at least two sets of variable length codewords in a sequence from a first set of data symbols to a last set of data symbols. The method is characterised by identifying a variable length codeword representative of a first data symbol in a given set of data symbols in said coding sequence other than the first set of data symbols and determining a set of cumulative information measures, each of said set of cumulative information measures being representative of a total amount of information required to variable length code the first data symbols of all sets of data symbols preceding the given set of data symbols in the coding sequence using a predetermined one of said at least two sets of variable length codewords. The set of cumulative information measures is examined to determine which of the at least two sets of variable length codewords provides the smallest cumulative information measure and the codeword representative of the first data symbol of the given set of data symbols is variable length decoded with reference to the set of variable length codewords which provides the smallest cumulative information measure.

Preferably, the set of cumulative information measures is determined by maintaining a set of running total information measures, each of the set of running total information measures being updated to represent the total amount of information required to variable length code the first data symbol of the given set of data symbols and the first data symbols of all sets of data symbols preceding the given set of data symbols in the coding sequence using a predetermined one of the at least two sets of variable length codewords in connection with variable length decoding of the first data symbol of the given set of data symbols.

Preferably, the variable length decoding method according to the third aspect of the invention further comprises variable length decoding a codeword representative of a data symbol other than the first data symbol of the set of data symbols with reference to a selected one of the at least two sets of variable length codewords, the selected one of said at least two sets of variable length codewords being chosen responsive to a value of previously decoded data symbol in the set of data symbols.

Preferably, each of the at least two sets of variable length codewords comprises a number of variable length codewords and a set of unique mappings is defined between the data symbols and the variable length codewords.

Advantageously, at least some of the variable length codewords comprised by one of the at least two sets of variable length codewords are different from those of another of the at least two sets of variable length codewords.

Preferably, each of the at least two sets of variable length codewords comprises the same variable length codewords and a different set of mappings between the data symbols and the variable length codewords is defined for each of the at least two sets of variable length codewords. Even more preferably, least some of the variable length codewords comprised by one of the at least two sets of variable length codewords are combinations of variable length codewords comprised by another of the at least two sets of variable length codewords.

Advantageously, the variable length decoding method according to the third aspect of the invention is implemented in a video decoder. Most preferably, the variable length decoding method is implemented in a mobile communications device, such as a mobile telephone or radio card, which can be connected, for example, to a personal computer in order to provide the device with radio communication functionality.

Advantageously, the data symbols are pairs of values, a first value of each of said pair of values being representative of a non-zero amplitude value and a second value of each of the pair of values being representative of a number of zero amplitude values preceding the non-zero amplitude value.

Preferably, the data symbols are pairs of values, a first value of each of said pair of values being representative of a non-zero amplitude value and a second value of each of said pair of values being representative of a number of zero amplitude values following said non-zero amplitude value.

Preferably, a codeword representative of a data symbol in a set of data symbols is variable length decoded with reference to a selected one of the at least two sets of variable length codewords, the selected one of said at least two sets of variable length codewords being chosen responsive to one of a) the first value, b) the second value, or c) both the first and the second value of a pair values for a previously decoded data symbol.

According to a fourth aspect of the invention, there is provided a decoder for variable length decoding variable length codewords. The decoder includes means for receiving a stream of variable length codewords representative of data symbols, the data symbols being arranged in a number of sets of data symbols, each set of data symbols comprising at least a first data symbol, said number of sets of data symbols having been variable length coded using variable length codewords selected from at least two sets of variable length codewords in a sequence from a first set of data symbols to a last set of data symbols. The decoder includes means for identifying a variable length codeword representative of a first data symbol in a given set of data symbols in said coding sequence other than the first set of data symbols. It further includes means for determining a set of cumulative information measures, each of the set of cumulative information measures being representative of a total amount of information required to variable length code the first data symbols of all sets of data symbols preceding the given set of data symbols in the coding sequence using a predetermined one of the at least two sets of variable length codewords, means for examining the set of cumulative information measures to determine which of the at least two sets of variable length codewords provides the smallest cumulative information measure and means for variable length decoding the codeword representative of said first data symbol of the given set of data symbols with reference to the set of variable length codewords which provides the smallest cumulative information measure.

Preferably, the decoder includes means for maintaining the set of cumulative information measures as a set of running totals.

Preferably, the decoder further includes means for variable length decoding a codeword representative of a data symbol other than the first data symbol of the set of data symbols with reference to a selected one of said at least two sets of variable length codewords, said means being arranged to choose the selected one of the at least two sets of variable length codewords responsive to a value of a previously decoded data symbol in the set of data symbols.

Advantageously, the decoder is arranged to variable length decode the first data symbol of the first set of data symbols in the coding sequence using a codeword selected from a predetermined one of the at least two sets of variable length codewords.

Preferably, the decoder is implemented in a video decoder. Most preferably, it is implemented in a mobile communications device, such as a mobile telephone or radio card, which can be connected, for example, to a personal computer in order to provide the device with radio communication functionality.

BRIEF DESCRIPTION OF THE DRAWINGS

Embodiments of the invention will now be described by example with reference to the appended drawings, in which.

DETAILED DESCRIPTION OF THE INVENTION

Figure 1:
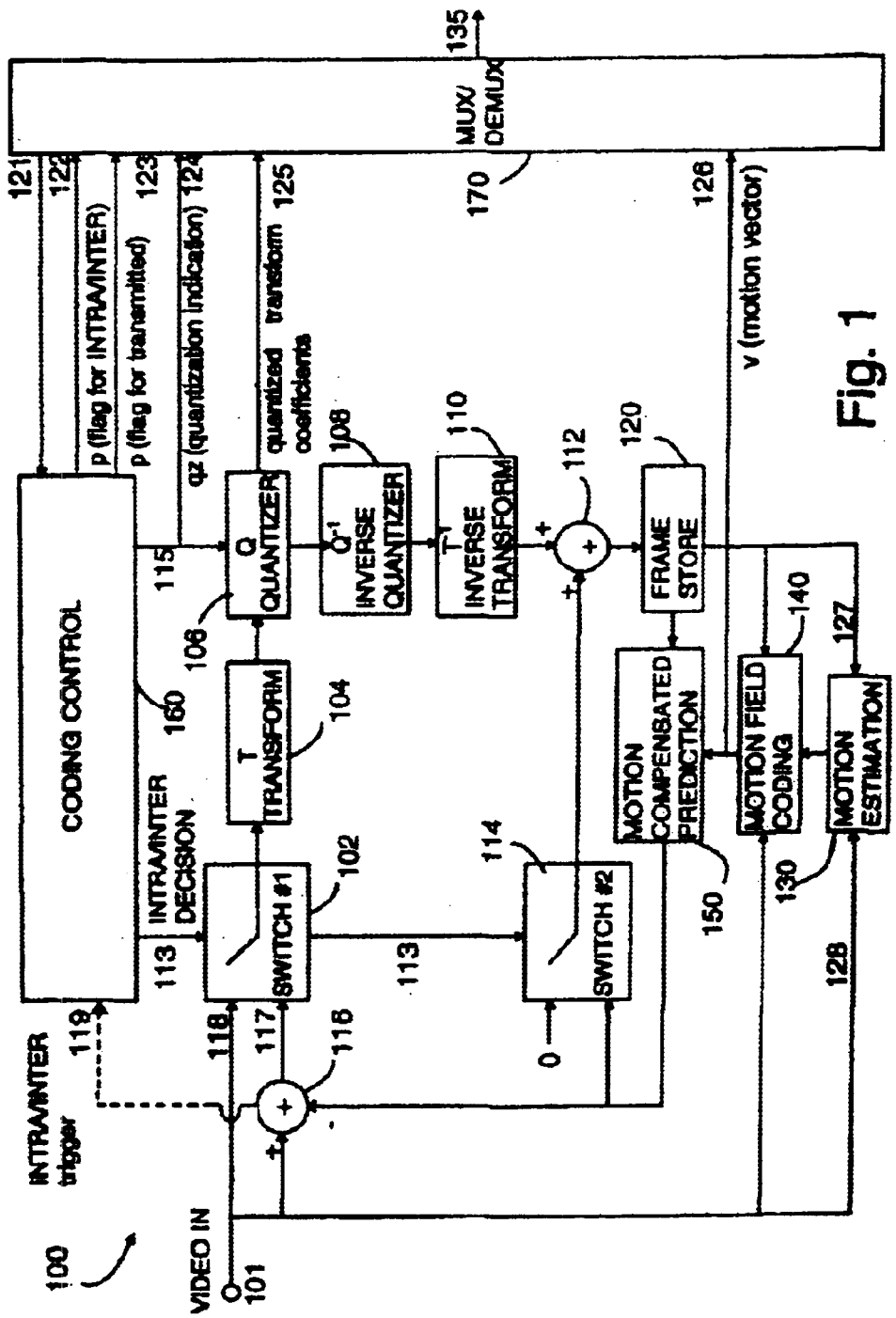
FIG. 1 is a schematic block diagram of a generic video encoder according to prior art.
Figure 6:
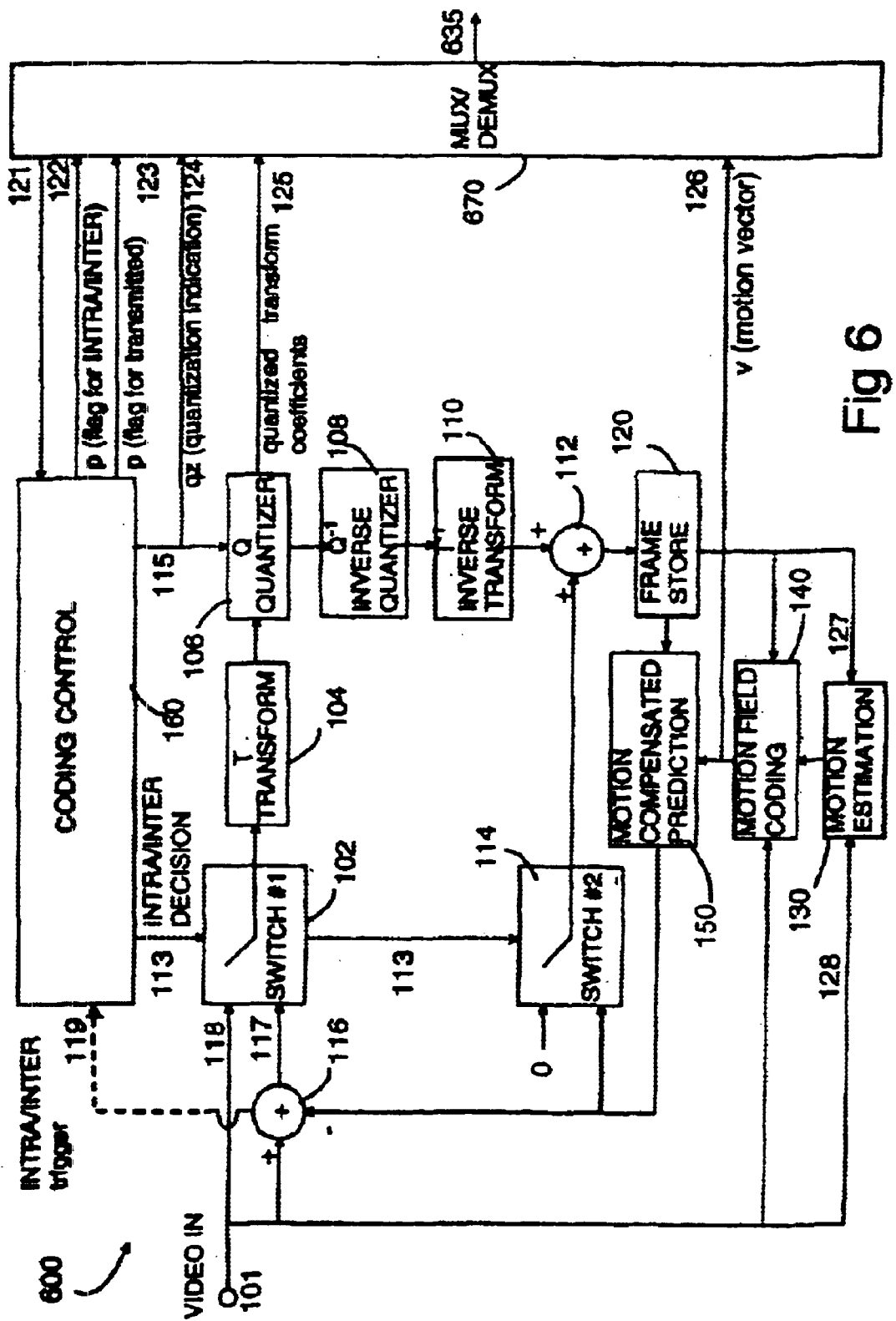
FIG. 6 is a schematic block diagram of a video encoder according to a preferred embodiment of the invention.

FIG. 6 is a schematic block diagram of a video encoder 600 in which the method of variable length coding according to the invention may be applied. The structure of the video encoder illustrated in FIG. 6 is substantially identical to that of the prior art video encoder shown in FIG. 1, with appropriate modifications to those parts of the encoder that perform variable length coding operations. All parts of the video encoder that implement functions and operate in a manner identical to the previously described prior art video encoder are identified with identical reference numbers.

According to a preferred embodiment, the method of variable length coding according to the invention is applied to INTRA-coded luminance blocks and chrominance blocks, as well as INTER-coded luminance and chrominance blocks. However, in alternative embodiments of the invention, application of the VLC coding method according to the invention may be restricted to only certain block types or combinations of block types. For example, the method may be applied only to INTRA-coded luminance blocks, INTRA-coded chrominance blocks, INTER-coded luminance blocks, INTER-coded chrominance blocks or any combination thereof. In further alternative embodiments of the invention, additional conditions may be applied, such that the method is used only in connection with a certain type of zigzag scanning procedure or quantisation parameter value, for example. However, such restrictions have no effect on the basic principles of the VLC coding method according to the invention.

Operation of video encoder 600 according to the preferred embodiment of the invention will now be described in detail. In INTRA-coding mode, the encoder's control manager 160 operates switch 102 to accept video input macroblock by macroblock from input 101 via line 118, each macroblock comprising blocks of luminance and chrominance values. In INTER-coding mode, on the other hand, the control manager 160 operates switch 102 to receive its input from line 117, which comprises the output of combiner 116. The combiner 116 receives the video input signal from input 101 and forms macroblocks of prediction error data comprising blocks of luminance and chrominance values. In INTRA-coding mode, the blocks of luminance and chrominance values which make up a macroblock are passed to the DCT transformation block 104, which performs a 2-dimensional discrete cosine transform on each block of values, producing a 2-dimensional array of DCT coefficients for each luminance and chrominance block. Similarly, in INTER-coding mode, the blocks of luminance and chrominance prediction error values are passed to DCT transformation block 104 which produces corresponding 2-dimensional arrays of DCT coefficients for each block luminance and chrominance prediction error data.

Next the DCT coefficients for each luminance and chrominance block are passed to quantiser 106 where they are quantised using a quantisation parameter QP. Selection of the quantisation parameter QP is controlled by the control manager 160 via control line 115. The quantised DCT coefficients for each luminance and chrominance block are then passed from the quantiser 106 to the video multiplex coder 670, as indicated by line 125 in FIG. 6. In this description it will be assumed that all variable length coding operations according to the invention are performed by video multiplex coder 670. However, it should be appreciated that in alternative embodiments a separate variable length coding unit or units may be provided.

Figure 4:
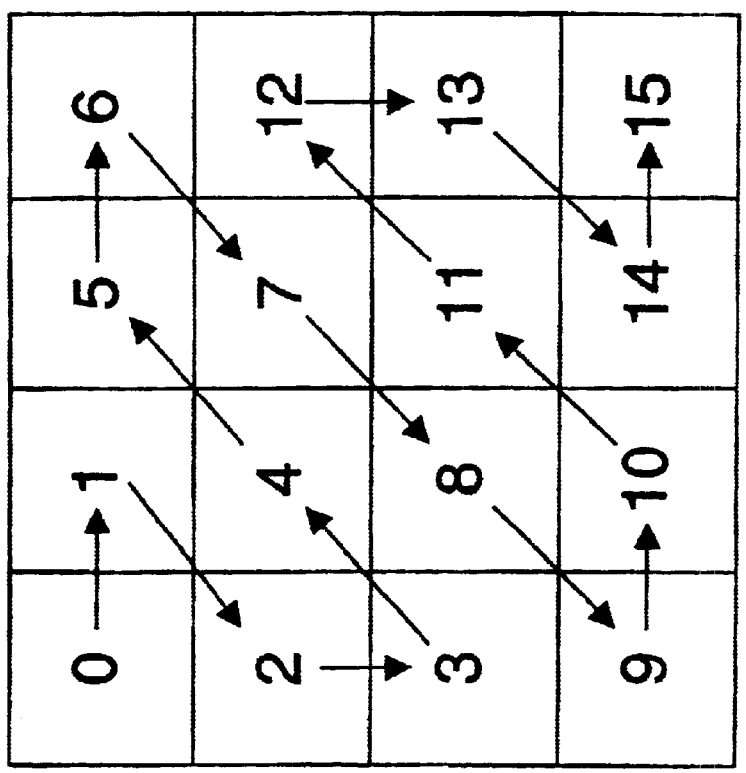
FIG. 4 illustrates an exemplary zigzag scanning order.
Figure 5:
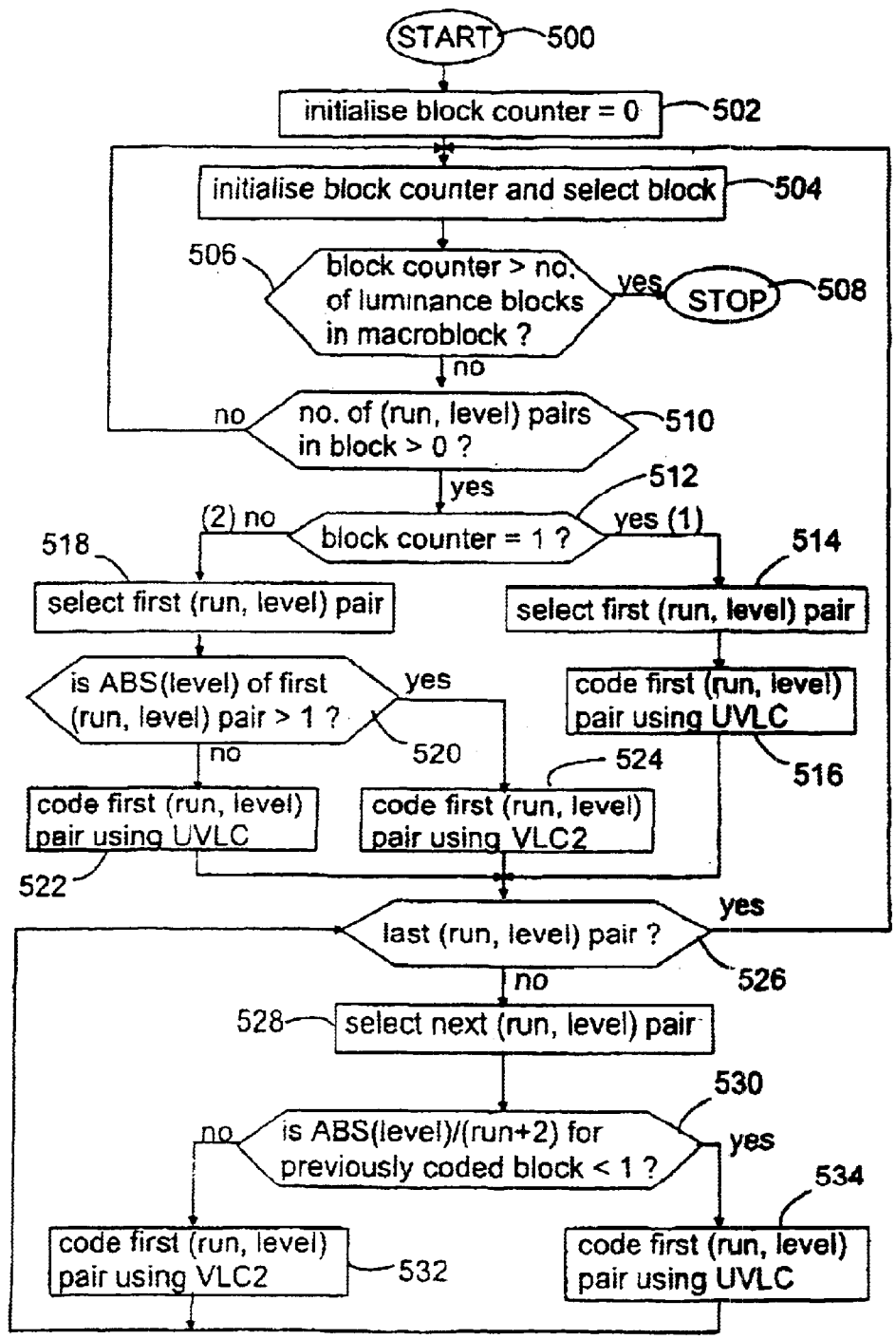
FIG. 5 illustrates a method of switching between sets of VLC codewords according to prior art.

In order to apply the VLC coding method according to the invention, the video multiplex coder 670 first orders the quantised transform coefficients for each luminance and chrominance block of a macroblock using a predefined zigzag scanning procedure, such as that shown in FIG. 4, or the double scan defined according to H.26L (see Q.15/SG16 "H.26L Test Model Long Term Number 5 (TML-5) draft 0", Doc. Q15-K-59, October 2000, Sections 3.4.1 and 3.4.2). As previously described, this operation converts the two-dimensional array of quantised transform coefficients for each luminance and chrominance block into a one-dimensional array. The particular zigzag scanning procedure used to order the coefficients may be selected, for example, according to the type of block (luminance or chrominance), or responsive to the coding mode (e.g. INTRA/INTER).

Next, the video multiplex coder 670 represents each non-zero quantised coefficient in the one-dimensional arrays for the luminance and chrominance blocks by run and level values. According to the preferred embodiment of the invention, this is done in a manner analogous to that previously described in connection with the prior art video encoder of FIG. 1. As a result, an ordered one-dimensional array of (run, level) pairs is produced for each luminance and chrominance block of the macroblock.

Figure 3:
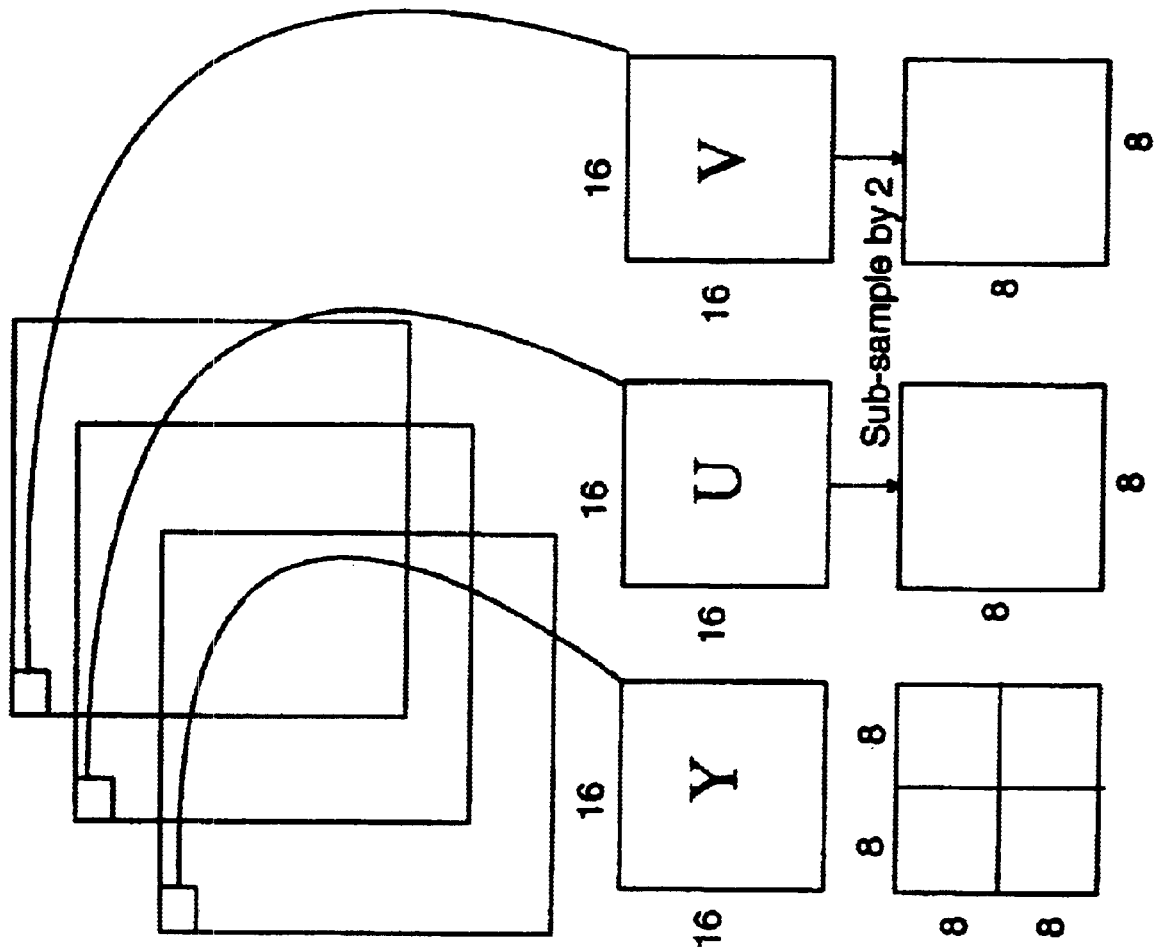
FIG. 3 illustrates the formation of a macroblock according to prior art.

Video multiplex coder 670 next entropy codes the (run, level) pairs for each luminance and chrominance block of the macroblock by applying the variable length coding method according to the invention. VLC coding is applied separately to the luminance component and the (two) chrominance components of the macroblock. More specifically, according to the preferred embodiment of the invention, the video multiplex coder first VLC codes the (run, level) pairs for the luminance blocks and then, applies the method according to the invention to each of the two chrominance components in turn. In alternative embodiments of the invention, other orders may be used. As the luminance component of a macroblock typically comprises more than one luminance block (see FIG. 3, for example), a predetermined processing order is defined and the luminance blocks are VLC coded one at a time, according to the predetermined processing order. The processing order may be fixed or may, in principle, vary from one macroblock to the next. However, according to the method of the invention, the precise order in which the blocks of a macroblock are VLC coded may affect the choice of codewords and thus influence the overall data compression achieved. Advantageously, according to the preferred embodiment of the invention, the video multiplex coder VLC codes the luminance blocks of each macroblock using the same processing order in each macroblock. If the chrominance components of a macroblock are also represented by more than one chrominance block, a predetermined processing order is also defined for the chrominance blocks.

According to the invention, the video multiplex coder VLC codes each of the (run, level) pairs for a given luminance or chrominance block by selecting a codeword from one of at least two sets of variable length codewords, according to certain selection rules. In an advantageous embodiment of the invention, one of the sets of codewords is the set of UVLC codewords defined according to H.26L and at least one other set of codewords is derived from the set of UVLC codewords. This may be the set of UVLC2 codewords, the set of UVLC3 codewords, or any other set of codewords derived from the UVLC codeword set according to the previously described rules. In the preferred embodiment of the invention, three sets of codewords are used, the set of UVLC codewords, the set of UVLC2 codewords and the UVLC3 codeword set. Furthermore, according to the preferred embodiment of the invention, the codewords used to represent the (run, level) pairs are not stored in the encoder, but are generated as and when required. This is possible because each codeword is generated according to predefined rules, as illustrated by Tables 2, 7 and 8. Therefore, if the encoder is aware of the rules used to construct the three sets of codewords (UVLC, UVLC2 and UVLC3), it can generate any codeword as and when it is required to code a particular (run, length) pair. This principle can be extended to any set(s) of codewords generated according to predefined construction rules. It should be noted, however, that in some embodiments it may be advantageous to store the codewords in the encoder in the form of coding (look-up) tables, even if they can be generated according to predetermined construction rules. This approach may be advantageous, for example, if there is sufficient memory available in the encoder and it is considered more important to reduce the computational complexity of the VLC coding process as much as possible.

As the method of variable length coding according to the invention operates in an essentially identical manner irrespective of whether a luminance or chrominance block is being coded, the following description applies equally well to the VLC coding of both luminance and chrominance blocks.

According to the preferred embodiment of the invention, the first non-zero-valued coefficient (that is, (run, level) pair) in an arbitrary block is encoded as follows. The video multiplex coder maintains a set of cumulative total information measures, each of which represents the amount of information (for example, the number of bits) required to VLC code all corresponding first coefficients so far encountered (excluding that for the block being coded), using a given one of the available sets of VLC codewords. More specifically, according to the preferred embodiment of the invention, in which it is possible to use VLC codewords selected from either the set of UVLC codewords, the set of UVLC2 codewords or the set of UVLC3 codewords, the video multiplex coder maintains three cumulative total information measures for each of the luminance and two chrominance components for both INTRA- and INTER-coded blocks (i.e. a total of 18 measures). Each cumulative information measure represents the total number of bits required to VLC code the first (run, level) pairs of all first (run, level) pairs so far encountered in other, previously processed blocks of the same type (e.g. INTRA- or INTER-coded luminance or chrominance) using a specific one of the three available sets of VLC codewords. The video multiplex coder examines the cumulative total information measures and VLC codes the first (run, level) pair of the block currently being coded using a codeword selected from the set of VLC codewords which yields the smallest cumulative total information measure.

At this point each of the cumulative total information measures is updated. This is done by determining the amount of information that would have been used to VLC code the first (run, level) pair of the current block using each one of the available sets of codewords and adding a value representative of that amount of information to the corresponding cumulative total information measure.

According to the preferred embodiment of the invention, the video multiplex coder maintains the cumulative total information measures as running totals in the memory of the encoder 600 and resets them to zero at specific predetermined intervals. For example, the cumulative total information measures may be reset to zero every n blocks, every macroblock, or every Group of Blocks (GOB). The way in which the cumulative information measures are maintained and reset to zero may depend on the coding mode of the image being processed. For example, according to the preferred embodiment of the invention, the cumulative total information measures are reset to zero at the beginning of each Group of Blocks for INTRA-coded images and at the start of every new macroblock for INTER-coded images. The first (run, level) pair to be VLC coded after the cumulative total information measures are reset to zero is coded using a codeword selected from a predetermined one of the available sets of VLC codewords. In the preferred embodiment of the invention, a codeword selected from the set of UVLC2 codewords is used to VLC code the first (run, level) pair to be coded after a reset.

After the video multiplex coder has VLC coded the first (run, length) pair in a given block as described above, it proceeds to code any remaining non-zero-valued coefficients (i.e. (run, level) pairs) in the block. Each remaining (run, level) pair is VLC coded using a codeword selected from one of the available sets of VLC codewords. The set of VLC codewords selected to code a given one of the remaining (run, level) pairs is determined based on a value of at least one of the previously coded (run, level) pairs. In the preferred embodiment of the invention, the set of VLC codewords used to encode a given one of the remaining (run, level) pairs depends on both the run and level values of the previously coded (run, level) pair. For example, the set of VLC codewords used to code the second (run, level) pair in the block is determined by the run and level values of the first (run, level) pair, the set of VLC codewords used to code the third (run, level) pair in the block depends on the run and level values of the second (run, level) pair and so on. More specifically, according to the preferred embodiment of the invention, the set of VLC codewords used to code the current (run, level) pair is determined according to the following relationship where RUN refers to the run value of the previously coded (run, level) pair and LEVEL is the absolute value of the level of the previously coded (run, level) pair:
IF (RUN>=6)
   R=6;
ELSE
   R=RUN+1;
END
IF (LEVEL>5)
   L=5;
ELSE
   L=LEVEL;
END The two indices R and L determined according to the relationship presented above are then used to access a look-up table corresponding to Table 9 (shown below) stored in the memory of encoder 600. Each entry of Table 9 indicates a set of VLC codewords to be used. Entry "1" corresponds to the set of UVLC codewords, entry "2" to the set of UVLC2 codewords and entry "3" to the set of UVLC3 codewords.

TABLE 9

Look-up Table for the Selection of a Set of VLC Codewords
According to the Preferred Embodiment of the Invention

|   | R |   |   |   |   |   |
|---|---|---|---|---|---|---|
| L | 2 | 2 | 1 | 1 | 1 | 1 |
|   | 3 | 3 | 2 | 2 | 1 | 1 |
|   | 3 | 3 | 3 | 3 | 2 | 1 |
|   | 3 | 3 | 3 | 3 | 2 | 1 |
|   | 3 | 3 | 3 | 3 | 2 | 1 |

Using Table 9, the video multiplex coder is able to determine which of the available sets of VLC codewords should be used to code the current (run, level) pair and selects an appropriate codeword to represent the current (run, level) pair.

Figure 2:
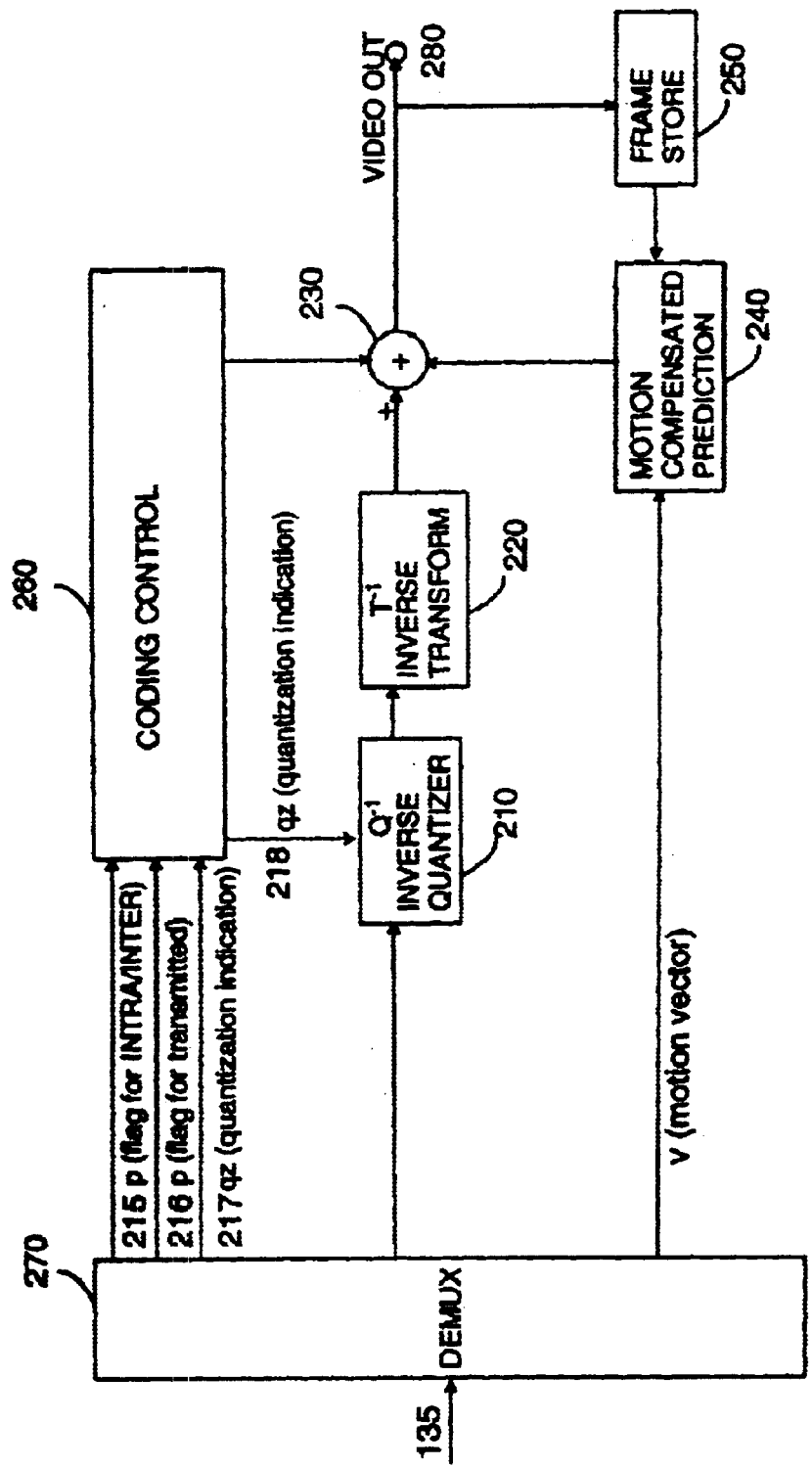
FIG. 2 is a schematic block diagram of a generic video decoder according to prior art and corresponding to the encoder shown in FIG. 1.
Figure 7:
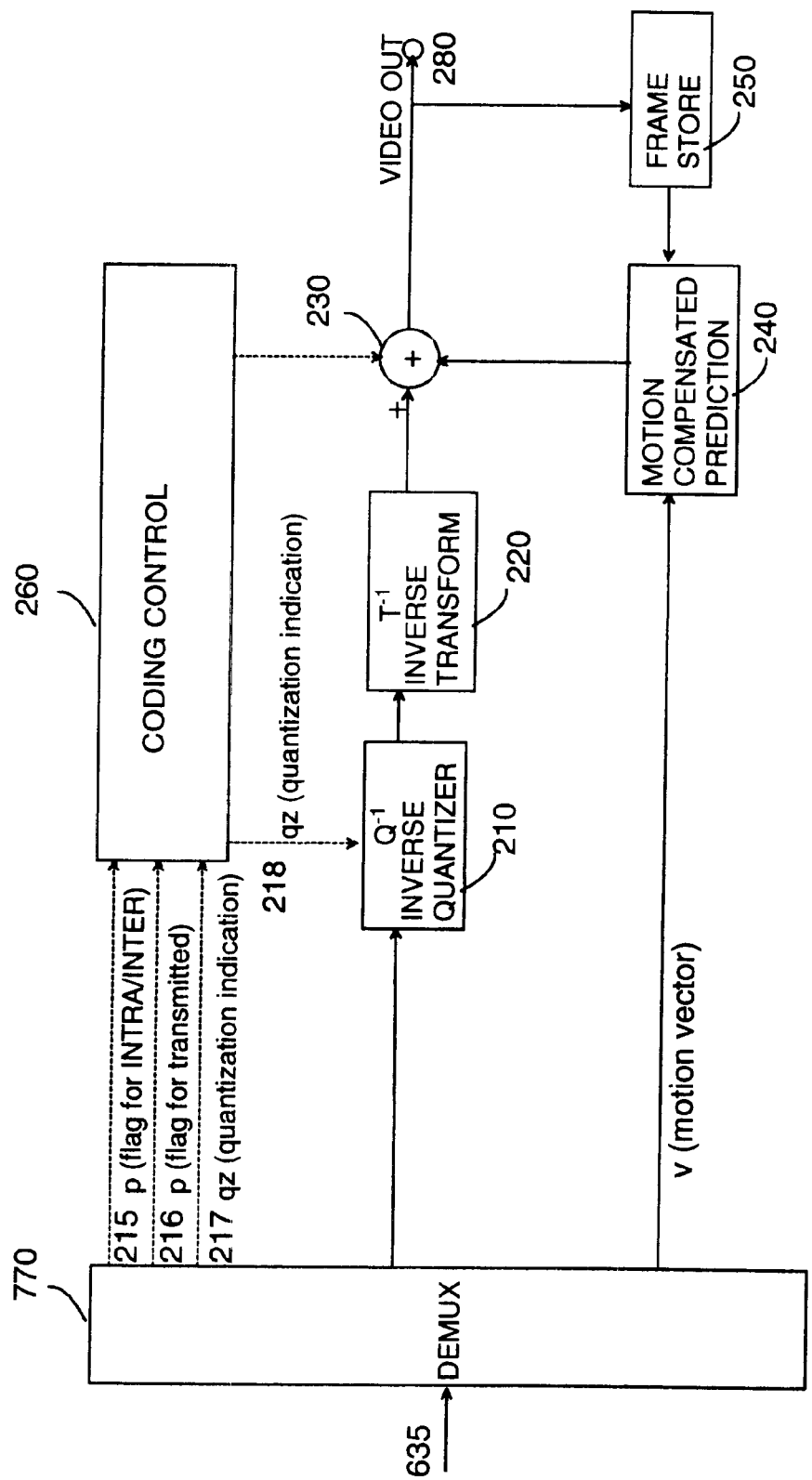
FIG. 7 is a schematic block diagram of a video decoder according to a preferred embodiment of the invention and corresponding to the encoder shown in FIG. 6.

Operation of a video decoder 700 according to a preferred embodiment of the invention will now be described with reference to FIG. 7. The structure of the video decoder illustrated in FIG. 7 is substantially identical to that of the prior art video decoder shown in FIG. 2, with appropriate modifications to those parts of the decoder that perform variable length decoding operations. All parts of the video decoder that implement functions and operate in a manner identical to the previously described prior art video decoder are identified with identical reference numbers. In the description that follows it is assumed that all variable length decoding operations are performed in video multiplex decoder 770. However, it should be appreciated that in alternative embodiments of the invention a separate variable length decoding unit or units may be provided.

Operation of the video decoder will now be described in detail. Here it is assumed that the video decoder of FIG. 7 corresponds to the encoder described in connection with FIG. 6 and is therefore capable of receiving and decoding a bit-stream 635 formed by encoder 600. In the decoder, the bit-stream is received and separated into its constituent parts by video multiplex decoder 770. As explained in connection with the earlier description of prior art, the compressed video data extracted from the bit-stream is processed on a macroblock-by-macroblock basis. The compressed video data for an INTRA-coded macroblock typically includes variable length codewords representing the VLC coded (run, level) pairs for each block of the macroblock, together with encoded control information (for example, relating to quantisation parameter QP). The compressed video data for an INTER-coded macroblock includes VLC encoded prediction error information for each block, motion vector information for the macroblock and encoded control information.

As explained above, in the preferred embodiment of the invention, the variable length coding method according to the invention is applied to INTRA-coded luminance blocks and chrominance blocks, as well as INTER-coded luminance and chrominance blocks. Thus, according to the preferred embodiment of the invention, the video multiplex decoder applies corresponding variable length decoding operations to the VLC codewords representing those classes of information extracted from the received bit-stream 635. As the method of variable length decoding according to the invention comprises essentially identical operations, irrespective of whether codewords representative of a INTRA- or INTER-coded luminance or chrominance information are being decoded, the following description applies equally well to the decoding of codewords representing INTRA-coded luminance and chrominance blocks as well as INTER-coded luminance and chrominance prediction error blocks.

According to the preferred embodiment of the invention, a codeword representative of the first non-zero-valued coefficient (that is, (run, level) pair) of an arbitrary block is decoded as follows. The video multiplex coder maintains a set of cumulative total information measures equivalent to those used in the VLC coding process in encoder 600. Each of the cumulative total information measures maintained in the decoder represents the amount of information (e.g. the number of bits) required to VLC code all corresponding first coefficients so far decoded (since the last reset), using a given one of the available sets of VLC codewords. Thus, when video multiplex decoder receives a codeword corresponding to the first (run, level) pair of an INTRA-coded luminance block, for example, it refers to a set of cumulative total information measures, each of which represents the total number of bits required to VLC code all first (run, level) pairs encountered in other, previously decoded blocks of the same type using a particular one of the available sets of VLC codewords. The video multiplex coder examines the cumulative total information measures and VLC decodes the codeword currently being coded using the set of VLC codewords corresponding to the smallest cumulative total information measure.

Having decoded the first (run, level) pair of current the block, video multiplex decoder next updates each of the cumulative total information measures. This is done in a manner analogous to that previously described in connection with the description of encoder 600. More specifically, the total cumulative information measures are updated by determining the amount of information that would have been used to VLC code the first (run, level) pair of the current block using each one of the available sets of codewords and adding a value representative of that amount of information to the corresponding cumulative total information measure. Thus, the cumulative total information measures are maintained as running totals in the memory of the decoder 700.

The video multiplex coder resets the cumulative total information measures to zero at specific predetermined intervals. In order to ensure correct decoding of subsequently received codewords, these intervals are chosen to be the same as those used in the encoder. As previously explained, a reset operation may be performed every n blocks, every macroblock, or every Group of Blocks (GOB). According to the preferred embodiment of the invention, the cumulative total information measures are reset to zero at the beginning of each Group of Blocks for INTRA-coded images and at the start of every new macroblock for INTER-coded images. The first codeword received after a reset is decoded using a codeword selected from a predetermined one of the available sets of VLC codewords. Again, this is chosen to correspond to the set of codewords used in the encoder to VLC code the first (run, length) after a reset in order to ensure correct decoding of the codeword in question and subsequently received codewords. In the preferred embodiment of the invention, the set of UVLC2 codewords is used to decode the first (run, level) pair to be coded after a reset.

After the video multiplex decoder has VLC decoded the codeword representative of the first (run, length) pair in a given block, as described above, it proceeds to decode any subsequently received codewords for the same block, in a manner corresponding to that used to VLC code the (run, level) pairs in encoder 600. More specifically, according to the preferred embodiment of the invention, the set of VLC codewords used to decode a codeword other than that representing the first (run, level) pair of a given block, is determined according to the previously described relationship and Table 9. Thus, the set of VLC codewords used to decode the second codeword received for a given block is determined by the run and level values of the first (run, level) pair decoded from the first codeword, the set of VLC codewords used to decode the third codeword for a given block depends on the run and level values of the second (run, level) pair decoded from the second codeword, and so on.

Figure 8:
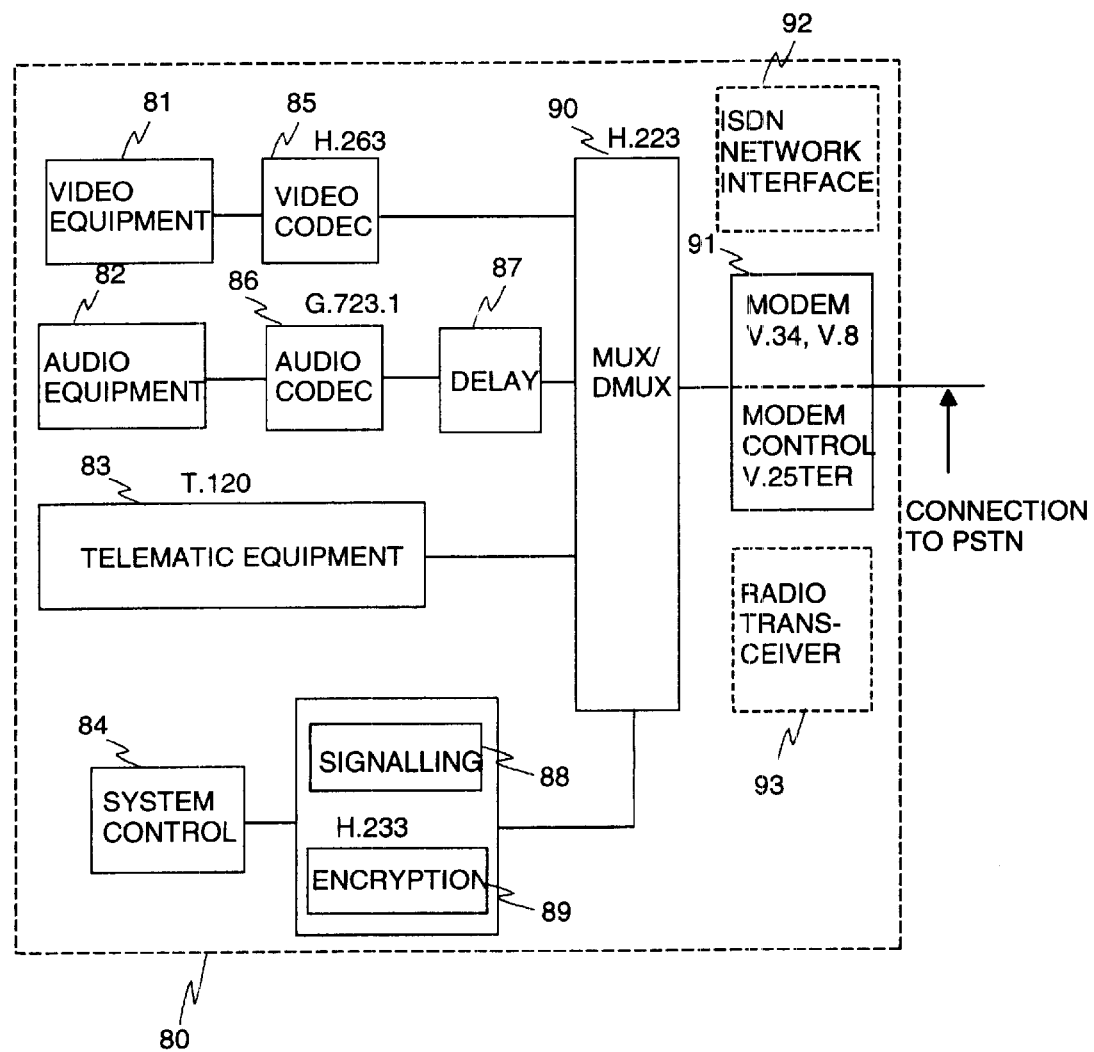
FIG. 8 is a schematic block diagram of a multimedia communications terminal in which the method according to the invention may be implemented.

FIG. 8 presents a terminal device comprising video encoding and decoding equipment which may be adapted to operate in accordance with the present invention. More precisely, the figure illustrates a multimedia terminal 80 implemented according to ITU-T recommendation H.324. The terminal can be regarded as a multimedia transceiver device. It includes elements that capture, encode and multiplex multimedia data streams for transmission via a communications network, as well as elements that receive, de-multiplex, decode and display received multimedia content. ITU-T recommendation H.324 defines the overall operation of the terminal and refers to other recommendations that govern the operation of its various constituent parts. This kind of multimedia terminal can be used in real-time applications such as conversational videotelephony, or non real-time applications such as the retrieval/streaming of video clips, for example from a multimedia content server in the Internet.

In the context of the present invention, it should be appreciated that the H.324 terminal shown in FIG. 8 is only one of a number of alternative multimedia terminal implementations suited to application of the inventive method. It should also be noted that a number of alternatives exist relating to the location and implementation of the terminal equipment. As illustrated in FIG. 8, the multimedia terminal may be located in communications equipment connected to a fixed line telephone network such as an analogue PSTN (Public Switched Telephone Network). In this case the multimedia terminal is equipped with a modem 91, compliant with ITU-T recommendations V.8, V.34 and optionally V.8bis. Alternatively, the multimedia terminal may be connected to an external modem. The modem enables conversion of the multiplexed digital data and control signals produced by the multimedia terminal into an analogue form suitable for transmission over the PSTN. It further enables the multimedia terminal to receive data and control signals in analogue form from the PSTN and to convert them into a digital data stream that can be demultiplexed and processed in an appropriate manner by the terminal.

An H.324 multimedia terminal may also be implemented in such a way that it can be connected directly to a digital fixed line network, such as an ISDN (Integrated Services Digital Network). In this case the modem 91 is replaced with an ISDN user-network interface. In FIG. 8, this ISDN user-network interface is represented by alternative block 92.

H.324 multimedia terminals may also be adapted for use in mobile communication applications. If used with a wireless communication link, the modem 91 can be replaced with any appropriate wireless interface, as represented by alternative block 93 in FIG. 8. For example, an H.324/M multimedia terminal can include a radio transceiver enabling connection to the current $2^{nd}$ generation GSM mobile telephone network, or the proposed $3^{rd}$ generation UMTS (Universal Mobile Telephone System).

It should be noted that in multimedia terminals designed for two-way communication, that is for transmission and reception of video data, it is advantageous to provide both a video encoder and video-decoder implemented according to the present invention. Such an encoder and decoder pair is often implemented as a single combined functional unit, referred to as a 'codec'.

A typical H.324 multimedia terminal will now be described in further detail with reference to FIG. 8.

The multimedia terminal 80 includes a variety of elements referred to as 'terminal equipment'. This includes video, audio and telematic devices, denoted generically by reference numbers 81, 82 and 83, respectively. The video equipment 81 may include, for example, a video camera for capturing video images, a monitor for displaying received video content and optional video processing equipment. The audio equipment 82 typically includes a microphone, for example for capturing spoken messages, and a loudspeaker for reproducing received audio content. The audio equipment may also include additional audio processing units. The telematic equipment 83, may include a data terminal, keyboard, electronic whiteboard or a still image transceiver, such as a fax unit.

The video equipment 81 is coupled to a video codec 85. The video codec 85 comprises a video encoder and a corresponding video decoder both implemented according to the invention. Such an encoder and a decoder will be described in the following. The video codec 85 is responsible for encoding captured video data in an appropriate form for further transmission over a communications link and decoding compressed video content received from the communications network. In the example illustrated in FIG. 8, the video codec is implemented according to ITU-T recommendation H.26L, with appropriate modifications to implement the adaptive variable length coding method according to the invention in both the encoder and the decoder of the video codec.

The terminal's audio equipment is coupled to an audio codec, denoted in FIG. 8 by reference number 88. Like the video codec, the audio codec comprises an encoder/decoder pair. It converts audio data captured by the terminal's audio equipment into a form suitable for transmission over the communications link and transforms encoded audio data received from the network back into a form suitable for reproduction, for example on the terminal's loudspeaker. The output of the audio codec is passed to a delay block 87.

This compensates for the delays introduced by the video coding process and thus ensures synchronisation of audio and video content.

The system control block 84 of the multimedia terminal controls end-to-network signalling using an appropriate control protocol (signalling block 88) to establish a common mode of operation between a transmitting and a receiving terminal. The signalling block 88 exchanges information about the encoding and decoding capabilities of the transmitting and receiving terminals and can be used to enable the various coding modes of the video encoder. The system control block 84 also controls the use of data encryption. Information regarding the type of encryption to be used in data transmission is passed from encryption block 89 to the multiplexer/demultiplexer (MUX/DMUX unit) 90.

During data transmission from the multimedia terminal, the MUX/DMUX unit 90 combines encoded and synchronised video and audio streams with data input from the telematic equipment 83 and possible control data, to form a single bit-stream. Information concerning the type of data encryption (if any) to be applied to the bit-stream, provided by encryption block 89, is used to select an encryption mode. Correspondingly, when a multiplexed and possibly encrypted multimedia bit-stream is being received, MUX/DMUX unit 90 is responsible for decrypting the bit-stream, dividing it into its constituent multimedia components and passing those components to the appropriate codec(s) and/or terminal equipment for decoding and reproduction.

It should be noted that the functional elements of the multimedia terminal, video encoder, decoder and video codec according to the invention can be implemented as software or dedicated hardware, or a combination of the two. The variable length coding and decoding methods according to the invention are particularly suited for implementation in the form of a computer program comprising machine-readable instructions for performing the functional steps of the invention. As such, the variable length encoder and decoder according to the invention may be implemented as software code stored on a storage medium and executed in a computer, such as a personal desktop computer.

If the multimedia terminal 80 is a mobile terminal, that is, if it is equipped with a radio transceiver 93, it will be understood by those skilled in the art that it may also comprise additional elements. In one embodiment it comprises a user interface having a display and a keyboard, which enables operation of the multimedia terminal 80 by a user, a central processing unit, such as a microprocessor, which controls the blocks responsible for different functions of the multimedia terminal, a random access memory RAM, a read only memory ROM, and a digital camera. The microprocessor's operating instructions, that is program code corresponding to the basic functions of the multimedia terminal 80, is stored in the read-only memory ROM and can be executed as required by the microprocessor, for example under control of the user. In accordance with the program code, the microprocessor uses the radio transceiver 93 to form a connection with a mobile communication network, enabling the multimedia terminal 80 to transmit information to and receive information from the mobile communication network over a radio path.

The microprocessor monitors the state of the user interface and controls the digital camera. In response to a user command, the microprocessor instructs the camera to record digital images into the RAM. Once an image is captured, or alternatively during the capturing process, the microprocessor segments the image into image segments (for example macroblocks) and uses the encoder to perform motion compensated encoding for the segments in order to generate a compressed image sequence as explained in the foregoing description. A user may command the multimedia terminal 80 to display the captured images on its display or to send the compressed image sequence using the radio transceiver 93 to another multimedia terminal, a video telephone connected to a fixed line network (PSTN) or some other telecommunications device. In a preferred embodiment, transmission of image data is started as soon as the first segment is encoded so that the recipient can start a corresponding decoding process with a minimum delay.

What is claimed is:

1. A method of variable length coding data symbols, said data symbols being arranged in a number of sets of data symbols, each set of data symbols comprising at least a first data symbol, at least two sets of variable length codewords being provided for variable length coding said data symbols, said number of sets of data symbols being variable length coded in a coding sequence, from a first set of data symbols to a last set of data symbols, characterised in that the method comprises:

for a given set of data symbols in said coding sequence other than the first set of data symbols, determining for each one of said at least two sets of variable length codewords a total amount of information required to variable length code the first data symbols of all sets of data symbols preceding said given set of data symbols in said coding sequence by determining a set of cumulative information measures;

examining said set of cumulative information measures to determine which of said at least two set of variable length codewords provides the smallest cumulative information measure; and selecting a codeword for variable length coding said first data symbol of said given set of data symbols from the set of variable length codewords which provides the smallest cumulative information measure.

2. A method according to claim 1, characterised in that said data symbols are pairs of values, a first value of each of said pair of values being representative of a non-zero amplitude value in a set of information symbols, and a second value of each of said pair of values being representative of a number of zero amplitude values preceding said non-zero amplitude value in said set of information symbols to be coded.

3. A method according to claim 2, characterised in that a data symbol in a set of data symbols is variable length coded using a codeword from a selected one of said at least two sets of variable length codewords, said selected one of said at least two sets of variable length codewords being chosen responsive to the first value of a pair of values for another data symbol in said set of data symbols.

4. A method according to claim 2, characterised in that the data symbols of a set of data symbols are variable length coded in a predetermined order and a data symbol in a set of data symbols is variable length coded using a codeword from a selected one of said at least two sets of variable length codewords, said selected one of said at least two sets of variable length codewords being chosen responsive to the first value of a pair of values of a preceding data symbol in said predetermined order.

5. A method according to claim 2, characterised in that a data symbol in a set of data symbols is variable length coded using a codeword from a selected one of said at least two sets of variable length codewords, said selected one of said at least two sets of variable length codewords being chosen responsive to the second value of a pair of values for another data symbol in said set of data symbols.

6. A method according to claim 2, characterised in that a data symbol in a set of data symbols is variable length coded using a codeword from a selected one of said at least two sets of variable length codewords, said selected one of said at least two sets of variable length codewords being chosen responsive to both the first and the second value of a pair of values for another data symbol in said set of data symbols.

7. A method according to claim 2, characterised in that the data symbols of a set of data symbols are variable length coded in a predetermined order and a data symbol in a set of data symbols is variable length coded using a codeword from a selected one of said at least two sets of variable length codewords, said selected one of said at least two sets of variable length codewords being chosen responsive to the second value of a pair of values of a preceding data symbol in said predetermined order.

8. A method according to claim 2, characterised in that the data symbols of a set of data symbols are variable length coded in a predetermined order and a data symbol in a set of data symbols is variable length coded using a codeword from a selected one of said at least two sets of variable length codewords, said selected one of said at least two sets of variable length codewords being chosen responsive to both the first and the second value of a pair of values of a preceding data symbol in said predetermined order.

9. A method according to claim 1, characterised in that said set of cumulative information measures is determined by maintaining a set of running total information measures, each of said set of running total information measures being updated to represent the total amount of information required to variable length code the first data symbol of said given set of data symbols and the first data symbols of all sets of data symbols preceding the given set of data symbols in said coding sequence using a predetermined one of said at least two sets of variable length codewords in connection with variable length coding of the first data symbol of said given set of data symbols.

10. A method according to claim 1, characterised in that the method further comprises variable length coding a data symbol other than the first data symbol of a set of data symbols using a codeword from a selected one of said at least two sets of variable length codewords, said selected one of said at least two sets of variable length codewords being chosen responsive to a value of another data symbol in said set of data symbols.

11. A method according to claim 1, characterised in that the data symbols of a set of data symbols are variable length coded in a predetermined order and the method further comprises variable length coding a data symbol other than the first data symbol of a set of data symbols using a codeword from a selected one of said at least two sets of variable length codewords, said selected one of said at least two sets of variable length codewords being chosen responsive to a value of a preceding data symbol in said predetermined order.

12. A method according to claim 1, characterised in that the first data symbol of the first set of data symbols in said coding sequence is variable length coded using a codeword selected from a predetermined one of said at least two sets of variable length codewords.

13. A method according to claim 1, characterised in that each of said at least two sets of variable length codewords comprises a number of variable length codewords and a set of unique mappings is defined between said data symbols and said variable length codewords.

14. A method according to claim 1, characterised in that at least a part of the variable length codewords comprised by one of said at least two sets of variable length codewords are different from those of another of said at least two sets of variable length codewords.

15. A method according to claim 1, characterised in that each of said at least two sets of variable length codewords comprises the same variable length codewords, wherein a different set of mappings between said data symbols and said variable length codewords is defined for each of said at least two sets of variable length codewords.

16. A method according to claim 1, characterised in that at least a part of the variable length codewords comprised by one of said at least two sets of variable length codewords are combinations of variable length codewords comprised by another of said at least two sets of variable length codewords.

17. A method according to claim 1, characterised in that it is implemented in a video encoder.

18. A method according to claim 1, characterised in that said data symbols are representative of transform coefficient values.

19. A method according to claim 1, characterised in that said data symbols are pairs of values, a first value of each of said pair of values being representative of a non-zero amplitude value in a set of information symbols, and a second value of each of said pair of values being representative of a number of zero amplitude values following said non-zero amplitude value in said set of information symbols to be coded.

20. A method according to claim 1, characterised in that it further comprises forming a bit-stream including variable length coded data symbols.

21. An encoder for variable length coding data symbols, said data symbols being arranged in a number of sets of data symbols, each set of data symbols comprising at least a first data symbol, at least two sets of variable length codewords being provided for variable length coding said data symbols, the encoder being arranged to variable length code said number of sets of data symbols in a coding sequence, from a first set of data symbols to a last set of data symbols, characterised in that the encoder includes:

means for processing a given set of data symbols other than the first set of data symbols in said coding sequence to determine for each one of said at least two sets of variable length codewords a total amount of information required to variable length code the first data symbols of all sets of data symbols preceding said given set of data symbols in said coding sequence by determining a set of cumulative information measures;

means for examining said set of cumulative information measures to determine which of said at least two sets of variable length codewords provides the smallest cumulative information measure; and means for selecting a codeword for variable length coding said first data symbol of said given set of data symbols from the set of variable length codewords which provides the smallest cumulative information measure.

22. An encoder according to claim 1, characterised in that said data symbols are pairs of values, a first value of each of said pair of values being representative of a non-zero amplitude value in a set of information symbols, and a second value of each of said pair of values being representative of a number of zero amplitude values preceding said non-zero amplitude value in said set of information symbols to be coded.

23. An encoder according to claim 22, characterised in that it includes means for variable length coding a data symbol in a set of data symbols using a codeword from a selected one of said at least two sets of variable length codewords, and means for choosing said selected one of said at least two sets of variable length codewords responsive to the first value of a pair of values for another data symbol in said set of data symbols.

24. An encoder according to claim 22, characterised in that it includes means for variable length coding the data symbols of a set of data symbols in a predetermined order, means for variable length coding a data symbol in a set of data symbols using a codeword from a selected one of said at least two sets of variable length codewords, and means for choosing said selected one of said at least two sets of variable length codewords responsive to the first value of a pair of values of a preceding data symbol in said predetermined order.

25. An encoder according to claim 22, characterised in that it includes means for variable length coding a data symbol in a set of data symbols using a codeword from a selected one of said at least two sets of variable length codewords, and means for choosing said selected one of said at least two sets of variable length codewords responsive to the second value of a pair of values for another data symbol in said set of data symbols.

26. An encoder according to claim 22, characterised in that it includes means for variable length coding a data symbol in a set of data symbols using a codeword from a selected one of said at least two sets of variable length codewords, and means for choosing said selected one of said at least two sets of variable length codewords responsive to both the first and the second value of a pair of values for another data symbol in said set of data symbols.

27. An encoder according to claim 22, characterised in that it includes means for variable length coding the data symbols of a set of data symbols in a predetermined order, means for variable length coding a data symbol in a set of data symbols using a codeword from a selected one of said at least two sets of variable length codewords, and means for choosing said selected one of said at least two sets of variable length codewords responsive to the second value of a pair of values of a preceding data symbol in said predetermined order.

28. An encoder according to claim 22, characterised in that it includes means for variable length coding the data symbols of a set of data symbols in a predetermined order, means for variable length coding a data symbol in a set of data symbols using a codeword from a selected one of said at least two sets of variable length codewords, and means for choosing said selected one of said at least two sets of variable length codewords responsive to both the first and the second value of a pair of values of a preceding data symbol in said predetermined order.

29. An encoder according to claim 21, characterised in that it includes means for determining said set of cumulative information measures by maintaining a set of running total information measures, and means for updating each of said running total information measures to represent the total amount of information required to variable length code the first data symbol of said given set of data symbols and the first data symbols of all sets of data symbols preceding the given set of data symbols in said coding sequence using a predetermined one of said at least two sets of variable length codewords in connection with variable length coding of the first data symbol of said given set of data symbols.

30. An encoder according to claim 21, characterised in that it further includes means for variable length coding a data symbol other than the first data symbol of a set of data symbols using a codeword from a selected one of said at least two sets of variable, length codewords, said means being arranged to choose said selected one of said at least two sets of variable length codewords responsive to a value of another data symbol in said set of data symbols.

31. An encoder according to claim 21, characterised in that the data symbols of a set of data symbols are arranged to be variable length coded in a predetermined order and the encoder further includes means for variable length coding a data symbol other than the first data symbol of a set of data symbols using a codeword from a selected one of said at least two sets of variable length codewords, and means for choosing said selected one of said at least two sets of variable length codewords responsive to a value of a preceding data symbol in said predetermined order.

32. An encoder according to claim 21, characterised in that the first data symbol of the first set of data symbols in said coding sequence is arranged to be variable length coded using a predetermined one of said at least two sets of variable length codewords.

33. An encoder according to claim 21, characterised in that each of said at least two sets of variable length codewords comprises a number of variable length codewords and a set of unique mappings is defined between said data symbols and said variable length codewords.

34. An encoder according to claim 21, characterised in that at least a part of the variable length codewords comprised by one of said at least two sets of variable length codewords are different from those of another of said at least two sets of variable length codewords.

35. An encoder according to claim 21, characterised in that each of said at least two sets of variable length codewords comprises the same variable length codewords, wherein a different set of mappings between said data symbols and said variable length codewords is defined for each of said at least two sets of variable length codewords.

36. An encoder according to claim 21, characterised in that at least a part of the variable length codewords comprised by one of said at least two sets of variable length codewords are combinations of variable length codewords comprised by another of said at least two sets of variable length codewords.

37. An encoder according to claim 21, characterised in that it is implemented in a video encoder.

38. An encoder according to claim 21, characterised in that said data symbols are representative of transform coefficient values.

39. An encoder according to claim 21, characterised in that said data symbols are pairs of values, a first value of each of said pair of values being representative of a non-zero amplitude value in a set of information symbols, and a second value of each of said pair of values being representative of a number of zero amplitude values following said non-zero amplitude value in said set of information symbols to be coded.

40. An encoder according to claim 21, characterised in that it further includes means for forming a bit-stream including variable length coded data symbols.

41. An encoder according to claim 21, characterised in that it is provided in a mobile communications device.

42. A method of variable length decoding comprising receiving a stream of variable length codewords representative of data symbols, said data symbols being arranged in a number of sets of data symbols, each set of data symbols comprising at least a first data symbol, said number of sets of data symbols having been variable length coded using variable length codewords selected from at least two sets of variable length codewords in a sequence from a first set of data symbols to a last set of data symbols, characterised in that the method includes:
- identifying a variable length codeword representative of a first data symbol in a given set of data symbols in said coding sequence other than the first set of data symbols and determining for each one of said at least two sets of variable length codewords a total amount of information required to variable length code the first data symbols of all sets of data symbols preceding said given set of data symbols in said coding sequence by determining a set of cumulative information measures;
- examining said set of cumulative information measures to determine which of said at least two sets of variable length codewords provides the smallest cumulative information measure; and
- variable length decoding the codeword representative of said first data symbol of said given set of data symbols with reference to the set of variable length codewords which provides the smallest cumulative information measure.

43. A method according to claim 42, characterised in that said data symbols are pairs of values, a first value of each of said pair of values being representative of a non-zero amplitude value in a set of information symbols, and a second value of each of said pair of values being representative of a number of zero amplitude values preceding said non-zero amplitude value in said set of information symbols to be coded.

44. A method according to claim 43, characterised in that a codeword representative of a data symbol in a set of data symbols is variable length decoded with reference to a selected one of said at least two sets of variable length codewords, said selected one of said at least two sets of variable length codewords being chosen responsive to the first value of a pair of values for a previously decoded data symbol.

45. A method according to claim 43, characterised in that a codeword representative of a data symbol in a set of data symbols is variable length decoded with reference to a selected one of said at least two sets of variable length codewords, said selected one of said at least two sets of variable length codewords being chosen responsive to the second value of a pair of values for a previously decoded data symbol.

46. A method according to claim 43, characterised in that a codeword representative of a data symbol in a set of data symbols is variable length decoded with reference to a selected one of said at least two sets of variable length codewords, said selected one of said at least two sets of variable length codewords being chosen responsive to both the first and the second value of a pair of values for a previously decoded data symbol.

47. A method according to claim 42, characterised in that said set of cumulative information measures is determined by maintaining a set of running total information measures, each of said set of running total information measures being updated to represent the total amount of information required to variable length code the first data symbol of said given set of data symbols and the first data symbols of all sets of data symbols preceding the given set of data symbols in said coding sequence using a predetermined one of said at least two sets of variable length codewords in connection with variable length decoding of the first data symbol of said given set of data symbols.

48. A method according to claim 42, characterised in that the method further comprises variable length decoding a codeword representative of a data symbol other than the first data symbol of the set of data symbols with reference to a selected one of said at least two sets of variable length codewords, said selected one of said at least two sets of variable length codewords being chosen responsive to a value of a previously decoded data symbol in said set of data symbols.

49. A method according to claim 42, characterised by the data symbols of a set of data symbols having been variable length coded in a predetermined order, the method further comprising variable length decoding a codeword representative of a data symbol other than the first data symbol of the set of data symbols with reference to a selected one of said at least two sets of variable length codewords, said selected one of said at least two sets of variable length codewords being chosen responsive to a value of a previously decoded data symbol in said predetermined order.

50. A method according to claim 42, characterised in that a codeword representative of the first data symbol of the first set of data symbols in said coding sequence is variable length decoded with reference to a predetermined one of said at least two sets of variable length codewords.

51. A method according to claim 42, characterised in that each of said at least two sets of variable length codewords comprises a number of variable length codewords and a set of unique mappings is defined between said data symbols and said variable length codewords.

52. A method according to claim 42, characterised in that at least a part of the variable length codewords comprised by one of said at least two sets of variable length codewords are different from those of another of said at least two sets of variable length codewords.

53. A method according to claim 42, characterised in that each of said at least two sets of variable length codewords comprises the same variable length codewords, wherein a different set of mappings between said data symbols and said variable length codewords is defined for each of said at least two sets of variable length codewords.

54. A method according to claim 42, characterised in that at least a part of the variable length codewords comprised by one of said at least two sets of variable length codewords are combinations of variable length codewords comprised by another of said at least two sets of variable length codewords.

55. A method according to claim 42, characterised in that it is implemented in a video decoder.

56. A method according to claim 42, characterised in that said data symbols are representative of transform coefficient values.

57. A method according to claim 42, characterised in that said data symbols are pairs of values, a first value of each of said pair of values being representative of a non-zero amplitude value in a set of information symbols, and a second value of each of said pair of values being representative of a number of zero amplitude values following said non-zero amplitude value in said set of information symbols to be coded.

58. A decoder for variable length decoding variable length codewords, including means for receiving a stream of variable length codewords representative of data symbols, said data symbols being arranged in a number of sets of data symbols, each set of data symbols comprising at least a first data symbol, said number of sets of data symbols having been variable length coded using variable length codewords selected from at least two sets of variable length codewords in a sequence from a first set of data symbols to a last set of data symbols, characterised in that the decoder includes:
- means for identifying a variable length codeword representative of a first data symbol in a given set of data symbols in said coding sequence other than the first set of data symbols;

means for determining for each one of said at least two sets of variable length codewords total amount of information requirea to variable length code the first data symbols of all sets of data symbols preceding said given set of data symbols in said coding sequence by determining a set of cumulative information measures;

means for examining said set of cumulative information measures to determine which of said at least two sets of variable length codewords provides the smallest cumulative information measure; and means for variable length decoding the codeword representative of said first data symbol of said given set of data symbols with reference to the set of variable length codewords which provides the smallest cumulative information measure.

59. A decoder according to claim 58, characterised in that said data symbols are pairs of values, a first value of each of said pair of values being representative of a non-zero amplitude value in a set of encoded information symbols, and a second value of each of said pair of values being representative of a number of zero amplitude values preceding said non-zero amplitude value in said set of encoded information symbols.

60. A decoder according to claim 59, characterised in that it includes means for variable length decoding a codeword representative of a data symbol in a set of data symbols with reference to a selected one of said at least two sets of variable length codewords, said means being arranged to choose said selected one of said at least two sets of variable length codewords responsive to the first value of a pair of values for a previously decoded data symbol.

61. A decoder according to claim 59, characterised in that it includes means for variable length decoding a codeword representative of a data symbol in a set of data symbols with reference to a selected one of said at least two sets of variable length codewords, said means being arranged to choose said selected one of said at least two sets of variable length codewords responsive to the second value of a pair of values for a previously decoded data symbol.

62. A decoder according to claim 59, characterised in that it includes means for variable length decoding a codeword representative of a data symbol in a set of data symbols with reference to a selected one of said at least two sets of variable length codewords, said means being arranged to choose said selected one of said at least two sets of variable length codewords responsive to both the first and the second value of a pair of values for a previously decoded data symbol.

63. A decoder according to claim 58, characterised in that it includes means for determining said set of cumulative information measures by maintaining a set of running total information measures, and means for updating each of said running total information measures to represent the total amount of information required to variable length code the first data symbol of said given set of data symbols and the first data symbols of all sets of data symbols preceding the given set of data symbols in said coding sequence using a predetermined one of said at least two sets of variable length codewords in connection with variable length decoding of the first data symbol of said given set of data symbols.

64. A decoder according to claim 58, characterised in that it further includes means for variable length decoding a codeword representative of a data symbol other than the first data symbol of the set of data symbols with reference to a selected one of said at least two sets of variable length codewords, said means being arranged to choose said selected one of said at least two sets of variable length codewords responsive to a value of a previously decoded data symbol in said set of data symbols.

65. A decoder according to claim 58, characterised in that a codeword representative of the first data symbol of the first set of data symbols in said coding sequence is arranged to be variable length decoded with reference to a predetermined one of said at least two sets of variable length codewords.

66. A decoder according to claim 58, characterised in that each of said at least two sets of variable length codewords comprises a number of variable length codewords and a set of unique mappings is defined between said data symbols and said variable length codewords.

67. A decoder according to claim 58, characterised in that at least a part of the variable length codewords comprised by one of said at least two sets of variable length codewords are different from those of another of said at least two sets of variable length codewords.

68. A decoder according to claim 58, characterised in that each of said at least two sets of variable length codewords comprises the same variable length codewords, wherein a different set of mappings between said data symbols and said variable length codewords is defined for each of said at least two sets of variable length codewords.

69. A decoder according to claim 58, characterised in that at least a part of the variable length codewords comprised by one of said at least two sets of variable length codewords are combinations of variable length codewords comprised by another of said at least two sets of variable length codewords.

70. A decoder according to claim 58, characterised in that it is implemented in a video decoder.

71. A decoder according to claim 58, characterised in that said data symbols are representative of transform coefficient values.

72. A decoder according to claim 58, characterised in that said data symbols are pairs of values, a first value of each of said pair of values being representative of a non-zero amplitude value in set of encoded information symbols, and a second value of each of said pair of values being representative of a number of zero amplitude values following said non-zero amplitude value in said set of encoded information symbols.

73. A decoder according to claim 58, characterised in that it is provided in a mobile communications device.

* * * * *

UNITED STATES PATENT AND TRADEMARK OFFICE
CERTIFICATE OF CORRECTION

PATENT NO. : 6,696,993 B2
DATED : February 24, 2004
INVENTOR(S) : Karczewicz

It is certified that error appears in the above-identified patent and that said Letters Patent is hereby corrected as shown below:

Title page,
Item [54], Title, please replace "VARIABLE LENGTH CODING" with
-- VARIABLE LENGTH CODING AND DECODING OF DATA SYMBOLS --

Column 38,
Line 30, please replace "set" with -- sets --

Column 40,
Line 57, please replace "1" with -- 21 --

Column 45,
Line 4, between "codewords" and "total" please insert -- a --.

Signed and Sealed this

Thirty-first Day of August, 2004

JON W. DUDAS
*Director of the United States Patent and Trademark Office*